US012604676B2

(12) United States Patent
Lin et al.

(10) Patent No.: US 12,604,676 B2
(45) Date of Patent: *Apr. 14, 2026

(54) MEMORY CELL, SEMICONDUCTOR DEVICE HAVING THE SAME, AND METHODS OF MANUFACTURING THE SAME

(71) Applicant: Taiwan Semiconductor Manufacturing Company, Ltd., Hsinchu (TW)

(72) Inventors: Yu-Chao Lin, Hsinchu (TW); Yu-Sheng Chen, Taoyuan (TW); Carlos H. Diaz, Los Altos Hills, CA (US); Da-Ching Chiou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 93 days.

This patent is subject to a terminal disclaimer.

(21) Appl. No.: 18/650,104

(22) Filed: Apr. 30, 2024

(65) Prior Publication Data

US 2024/0284809 A1 Aug. 22, 2024

Related U.S. Application Data

(63) Continuation of application No. 17/367,634, filed on Jul. 6, 2021, now Pat. No. 12,010,928.

(60) Provisional application No. 63/178,532, filed on Apr. 23, 2021.

(51) Int. Cl.
H10N 70/20 (2023.01)
H01L 23/528 (2006.01)

H10B 63/10 (2023.01)
H10N 70/00 (2023.01)

(52) U.S. Cl.
CPC ....... H10N 70/231 (2023.02); H01L 23/5283 (2013.01); H10B 63/10 (2023.02); H10N 70/063 (2023.02); H10N 70/8265 (2023.02); H10N 70/841 (2023.02); H10N 70/8616 (2023.02)

(58) Field of Classification Search
CPC .............. H10N 70/231; H10N 70/063; H10N 70/8265; H10N 70/841; H10N 70/8616; H10N 70/826; H10N 70/8413; H10N 70/861; H10N 70/8828; H10N 70/011; H01L 23/5283; H10B 63/00; H10B 63/10; H10B 63/24; H10B 63/80
See application file for complete search history.

(56) References Cited

U.S. PATENT DOCUMENTS 8,772,109 B2 7/2014 Colinge
8,785,285 B2 7/2014 Tsai et al.
8,816,444 B2 8/2014 Wann et al.
(Continued)

*Primary Examiner* — Allison Bernstein
(74) *Attorney, Agent, or Firm* — JCIPRNET

(57) ABSTRACT

A memory cell includes a bottom electrode, a storage element layer, a first buffer layer, and a top electrode. The storage element layer is disposed over the bottom electrode. The first buffer layer is interposed between the storage element layer and the bottom electrode, where a thermal conductivity of the first buffer layer is less than a thermal conductivity of the storage element layer. The top electrode is disposed over the storage element layer, where the storage element layer is disposed between the top electrode and the first buffer layer.

20 Claims, 38 Drawing Sheets

10

(56) References Cited

U.S. PATENT DOCUMENTS

| | | | | |
|---|---|---|---|---|
| 8,823,065 B2 | 9/2014 | Wang et al. | | |
| 8,860,148 B2 | 10/2014 | Hu et al. | | |
| 9,105,490 B2 | 8/2015 | Wang et al. | | |
| 9,236,267 B2 | 1/2016 | De et al. | | |
| 9,236,300 B2 | 1/2016 | Liaw | | |
| 9,419,212 B2 * | 8/2016 | Petz | ...................... | H10N 70/882 |
| 9,520,482 B1 | 12/2016 | Chang et al. | | |
| 9,576,814 B2 | 2/2017 | Wu et al. | | |
| 2014/0239245 A1 * | 8/2014 | Lengade | .............. | H10N 70/882 |
| | | | | 257/4 |
| 2019/0123273 A1 * | 4/2019 | Lee | ....................... | H10N 70/883 |
| 2021/0104666 A1 * | 4/2021 | Fu | .......................... | H10B 63/80 |

* cited by examiner

MEMORY CELL, SEMICONDUCTOR DEVICE HAVING THE SAME, AND METHODS OF MANUFACTURING THE SAME

CROSS-REFERENCE TO RELATED APPLICATION

This application is a continuation application of and claims the priority benefit of a prior application Ser. No. 17/367,634, filed on Jul. 6, 2021, now allowed, which claims the priority benefit of U.S. provisional applications Ser. No. 63/178,532, filed on Apr. 23, 2021. The entirety of each of the above-mentioned patent applications is hereby incorporated by reference herein and made a part of this specification.

BACKGROUND

Developments in shrinking sizes of semiconductor devices and electronic components make the integration of more devices and components into a given volume possible and lead to high integration density of various semiconductor devices and/or electronic components.

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a PCM is employed to represent a unit of data. PCM has fast read and write times, non-destructive reads, and high scalability.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
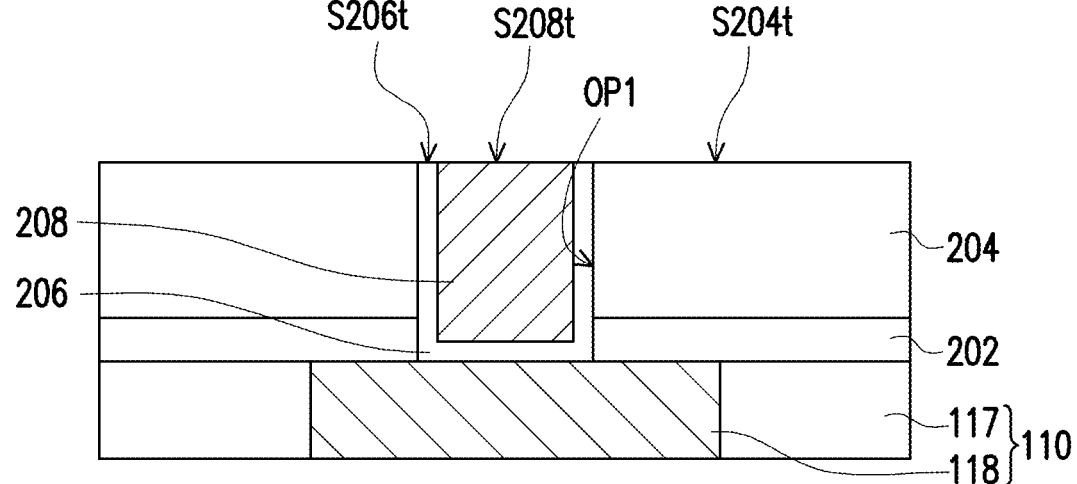
FIG. 1 through FIG. 7 are schematic cross-sectional views showing a method of manufacturing a memory cell in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second" and the like, may be used herein for case of description to describe similar or different element(s) or feature(s) as illustrated in the figures, and may be used interchangeably depending on the order of the presence or the contexts of the description.

It should be appreciated that the following embodiment(s) of the disclosure provides applicable concepts that can be embodied in a wide variety of specific contexts. The specific embodiment(s) discussed herein is merely illustrative and is related to a memory cell including a thermal buffer layer interposed between a storage element layer and a bottom electrode layer for better thermal control therein, and is not intended to limit the scope of the disclosure. In accordance with some embodiments, a thermal buffer layer is sandwiched between the storage element layer of phase change material and a bottom electrode layer inside a memory cell, where the thermal buffer layer has a thermal conductivity being less than a thermal conductivity of the storage element layer and a resistivity being less than a resistivity of the storage element layer. In the case, a thermal boundary resistance at the interface of the thermal buffer layer and the storage element layer is increased, which is beneficial to heat up the storage element layer even if applying a small input current onto the bottom electrode layer. Thus, the switchable performance of the memory cell is still maintained and done smoothly, as lowering the input current (e.g., a reset current) applied onto the bottom electrode layer.

On the other hand, since the thermal conductivity of the thermal buffer layer is less than the thermal conductivities of the storage element layer, there is a less heat dissipation for the thermal buffer layer as compared with the storage element layer, such that the thermal buffer layer further functions as a thermal insulating layer for the storage element layer. In other words, the thermal buffer layer suppresses the heat dissipation of the storage element layer to help maintaining a temperature of the storage element layer after being heated by the bottom electrode. Overall, since the small input current is utilized for operating the memory cell of the disclosure, a device density of the memory cell may be increased in a given area without violating the design requirement/constrain (e.g., relevant to the voltage or current overloading issue), thereby improving the performance of the semiconductor device having the memory cell in the disclosure.

The memory cell illustrated in the following embodiments may be applied to a phase change random access memory (PCRAM) cell, hereinafter referred to as a PCM cell. FIG. 1 through FIG. 7 are schematic cross-sectional views showing a method of manufacturing a memory cell in accordance with some embodiments of the disclosure.

Figure 7:
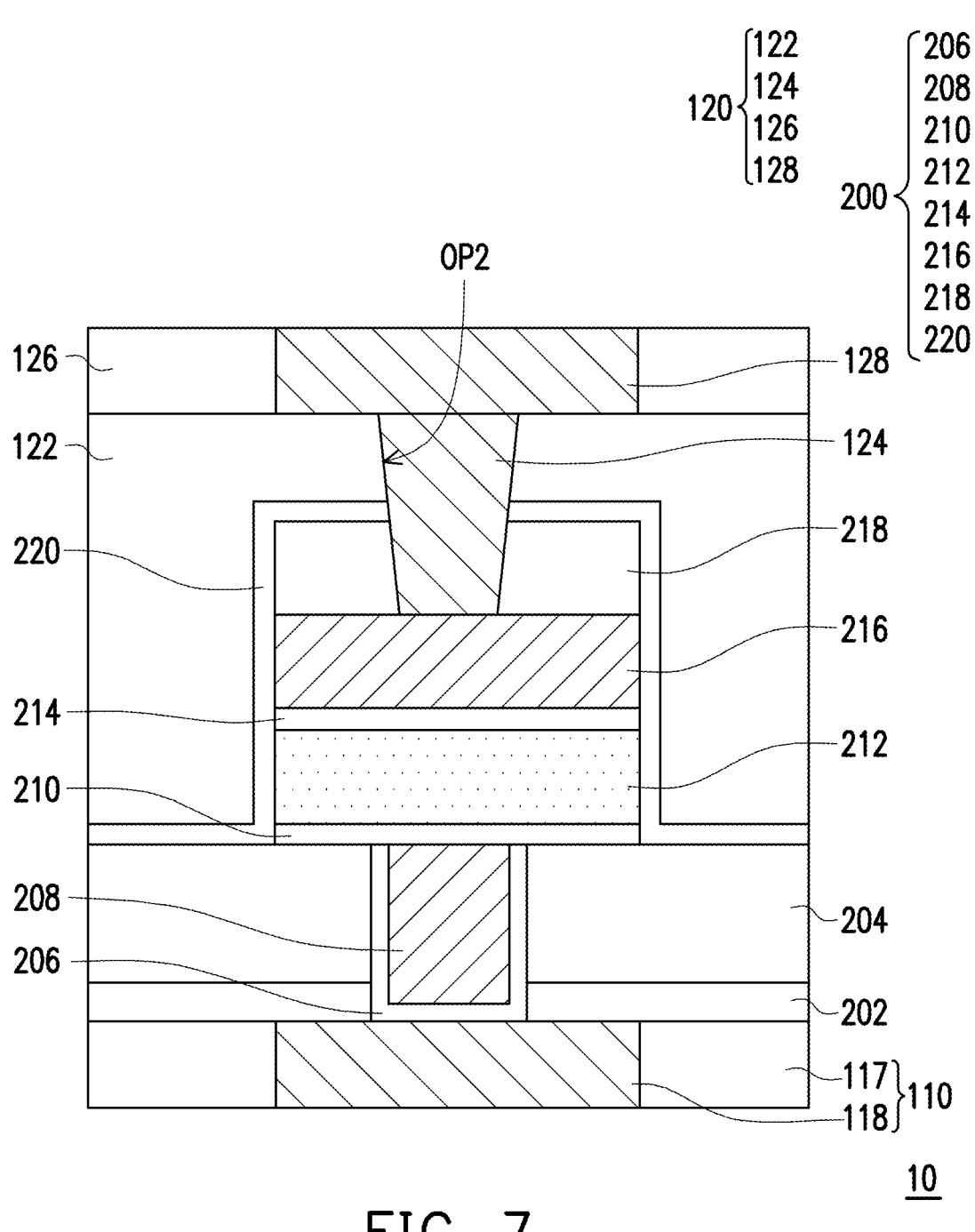

Referring to FIG. 1, in some embodiments, a method of forming a semiconductor device 10 having a memory cell 200 (as shown in FIG. 7) includes following steps. First, an initial structure illustrated in FIG. 1 is provided. The initial structure includes a first interconnect structure 110, a first dielectric layer 202, a second dielectric layer 204, a barrier layer 206, and a bottom electrode 208.

In detail, the first interconnect structure 110 may include an insulating layer 117 and a conductive layer 118 disposed in the insulating layer 117. In some embodiments, the insulating layer 117 is referred to as an inter-metal dielectric (IMD) layer which may be made of a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The conductive layer 118 may be a conductive line, and the conductive layer 118 may include commonly used conductive materials, such as metals or metal alloys including one or more of Al, AlCu, Cu, Ti, TiN, W, and the like. The conductive layer 118 forms a portion of a current driving circuit (not shown) to provide current to the PCM cell described subsequently.

A seed layer (not shown) may be optionally formed between the insulating layer 117 and the conductive layer 118. That is, for example, the seed layer covers a bottom surface and sidewalls of the conductive layer 118. In some embodiments, the seed layer is a metal layer, which may be a single layer or a composite layer comprising a plurality of sub-layers formed of different materials. In some embodiments, the conductive layer 118 includes copper (Cu) layer and the seed layer includes a titanium layer and a copper layer over the titanium layer. The seed layer is formed using, for example, physical vapor deposition (PVD) or the like. In one embodiment, the seed layer may be omitted.

In addition, an additional barrier layer or adhesive layer (not shown) may be optionally formed between the conductive layer 118 and the insulating layer 117. In embodiments of which the seed layer is included, the additional barrier layer or adhesive layer is formed between the seed layer and the insulating layer 117. Owing to the additional barrier layer or adhesive layer, it is able to prevent the seed layer and/or the conductive layer 118 from diffusing to the underlying layers and/or the surrounding layers. The additional barrier layer or adhesive layer may include Ti, TiN, Ta, TaN, a combination thereof, a multilayer thereof, or the like, and may be formed using (chemical vaper deposition) CVD, atomic layer deposition (ALD), PVD, a combination thereof, or the like. In one embodiment, the additional barrier layer or adhesive layer may be omitted.

Referring back to FIG. 1, in some embodiments, the first dielectric layer 202 and the second dielectric layer 204 are sequentially stacked on the first interconnect structure 110 to cover portions of the conductive layer 118. In some embodiments, the bottom electrode 208 is disposed in an opening OP1 penetrating through the first dielectric layer 202 and the second dielectric layer 204 to electrically couple to the conductive layer 118. In some embodiments, a top surface S208t of the bottom electrode 208 is exposed by a top surface S204t of the second dielectric layer 204. In some embodiments, the first dielectric layer 202 and the second dielectric layer 204 have different materials. For example, the first dielectric layer 202 includes a silicon carbide (SiC) layer and the second dielectric layer 204 includes a silicon-rich oxide layer. In some alternative embodiments, the first dielectric layer 202 and the second dielectric layer 204 have different etching selectivities. In the case, the first dielectric layer 202 may be referred to as an etching stop layer to prevent the underlying conductive layer 118 from damages caused by the over-etching.

In some embodiments, the barrier layer 206 is optionally interposed between the bottom electrode 208 and the first dielectric layer 202 and between the bottom electrode 208 and the second dielectric layer 204. In certain embodiments, the barrier layer 206 is further interposed between the bottom electrode 208 and the conductive layer 118. For example, as shown in FIG. 1, the barrier layer 206 is in contact with the conductive layer 118 and the bottom electrode 208 at a bottom surface thereof, in contact with the first dielectric layer 202 and the bottom electrode 208 at two opposite surfaces thereof, and in contact with the second dielectric layer 204 and the bottom electrode 208 at two opposite surfaces thereof.

In some embodiments, the barrier layer 206 includes a material to prevent the bottom electrode 208 from diffusing to the underlying layers and/or the surrounding layers. In some embodiments, the barrier layer 206 may include Ti, TiN, Ta, TaN, a combination thereof, a multilayer thereof, or the like, and may be formed using CVD, ALD, PVD, a combination thereof, or the like.

In some embodiments, the barrier layer 206 and the bottom electrode 208 are formed by a single damascene process including following steps. First, the opening OP1 is formed in the first dielectric layer 202 and the second dielectric layer 204 to expose a portion of the conductive layer 118. Then, a blanket of barrier layer material is conformally formed over the first dielectric layer 202 and the second dielectric layer 204 and further extended into the opening OP1. Then, the opening OP1 is filled with a conductive material over the blanket of barrier layer material. After that, a planarization process (e.g., a CMP process) is performed to remove excessive conductive material and the blanket of barrier layer material over a plane including the top surface S204t of the second dielectric layer 204, thereby forming the barrier layer 206 and bottom electrode 208.

In some embodiments, the bottom electrode 208 includes a conductive material, such as Ti, Co, Cu, AlCu, W, TiN, TiW, TiAl, TiAlN, Ru, RuO$_x$, or a combination thereof. In some alternative embodiments, the bottom electrode 208 is referred to as a heater that is electrically coupled to or in contact with the conductive layer 118. The heater is configured to generate heat in proportion to a current applied across the heater. In the case, the heater may be made of titanium nitride (TiN), titanium carbide (TiC), tungsten (W), tungsten nitride (WN), some other high resistance material, Ru, RuO$_x$, or a combination thereof. In addition, the heater may have a round, square, or rectangular profile in a top view. In one embodiment, the bottom electrode 208 includes TiN, and the barrier layer 206 includes TaN. However, the disclosure is not limited thereto; in another embodiment, the bottom electrode 208 includes W which has barely little or no bottom electrode 208 diffusing to the underlying layers and/or the surrounding layers, thus the barrier layer 206 is omitted. That is, the barrier layer 206 may be omitted depending on the design requirements and demand. After the planarization process, for example, a surface S206*t* of the barrier layer 206 and the top surface S208*t* of the bottom electrode 208 are substantially coplanar with the top surface S204*t* of the second dielectric layer 204 within the process variations.

Figure 2:
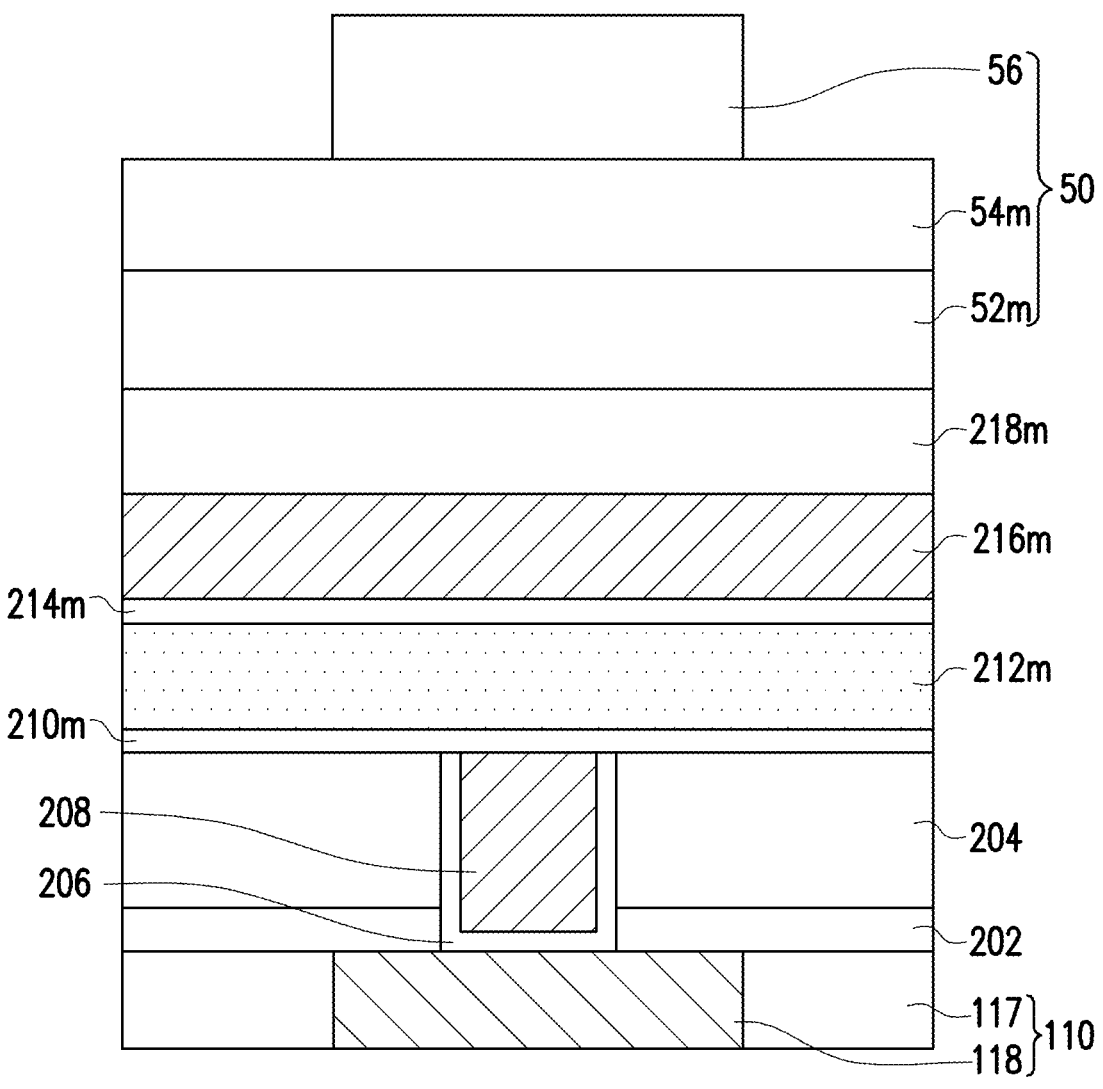

Referring to FIG. 2, in some embodiments, a stack structure is formed on the bottom electrode 208. For example, the stack structure includes a first buffer material layer 210*m*, a storage element material layer 212*m*, a second buffer material layer 214*m*, a top electrode material layer 216*m*, and a first hard mask material layer 218*m*, as shown in FIG. 2. The stack structure may be referred to as a stack of multiple material layers, where more or less material layers may be included in the stack structure based on the design requirement and demand, the disclosure is not limited thereto.

The first buffer material layer 210*m* is formed on and in contact with the second dielectric layer 204 and the bottom electrode 208, for example. In some embodiments, the bottom electrode 208 is sandwiched between (e.g., in physical contact with) the conductive layer 118 and the first buffer material layer 210*m*. In some embodiments, a material of the first buffer material layer 210*m* includes a thermal buffer material, which is allowed to beneficial to heat up a later-formed layer overlying thereon (e.g., a storage element layer in FIG. 6) as a given input current applied onto the bottom electrode 208. In some embodiments, the first buffer material layer 210*m* includes a material having a thermal conductivity less than a thermal conductivity of the storage element material layer 212*m* and an electrical resistivity less than an electrical resistivity of the storage element material layer 212*m*. In certain embodiment, the thermal conductivity of the material of the first buffer material layer 210*m* is further less than a thermal conductivity of the bottom electrode 208. In certain embodiment, the electrical resistivity of the material of the first buffer material layer 210*m* is further greater than an electrical resistivity of the bottom electrode 208. For example, the first buffer material layer 210*m* includes a carbon film (may be in amorphous phase), 2D material, graphene, or the like, which can be formed by PVD, transfer and lamination, or any suitable forming method. The first buffer material layer 210*m* may have a thickness of about 1 nm to about 3 nm.

The storage element material layer 212*m* is formed on and in contact with the first buffer material layer 210*m*, for example. In some embodiments, the first buffer material layer 210*m* is sandwiched between (e.g., in physical contact with) the bottom electrode 208 and the storage element material layer 212*m*. In some embodiments, the storage element material layer 212*m* includes a phase change material when the memory cell 200 (FIG. 7) is the PCM cell. The phase change material may include a chalcogenide material, such as an indium(In)-antimony(Sb)-tellurium(Te) (IST) material or a germanium(Ge)-antimony(Sb)-tellurium(Te) (GST) material. The ISG material may include $In_2Sb_2Te_5$, $In_1Sb_2Te_4$, $In_1Sb_2Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other storage element materials include transition metal oxide materials or alloys including two or more metals, such as transition metals, alkaline earth metals, and/or rare earth metals. The storage element material layer 212*m* may be formed by any suitable method, such as PVD, ALD, or the like. The storage element material layer 212*m* may have a thickness of about 20 nm to about 50 nm.

The second buffer material layer 214*m* is formed on and in contact with the storage element material layer 212*m*, for example. In some embodiments, the storage element material layer 212*m* is sandwiched between (e.g., in physical contact with) the first buffer material layer 210*m* and the second buffer material layer 214*m*. The formation and material of the second buffer material layer 214*m* are substantially identical or similar to the formation and material of the first buffer material layer 210*m* as discussed above, and thus are not repeated herein. The second buffer material layer 214*m* may have a thickness of about 1 nm to about 3 nm. In some embodiments, the thickness of the second buffer material layer 214*m* is the same as the thickness of the first buffer material layer 210*m*. Alternatively, the thickness of the second buffer material layer 214*m* may be greater than the thickness of the first buffer material layer 210*m*. Or, the thickness of the second buffer material layer 214*m* may be less than the thickness of the first buffer material layer 210*m*, the disclosure is not limited thereto.

In some embodiments, the second buffer material layer 214*m* includes a material having a thermal conductivity less than a thermal conductivity of the storage element material layer 212*m* and an electrical resistivity less than an electrical resistivity of the storage element material layer 212*m*. In certain embodiment, the thermal conductivity of the material of the second buffer material layer 214*m* is further less than a thermal conductivity of the top electrode material layer 216*m*. In certain embodiment, the electrical resistivity of the material of the second buffer material layer 214*m* is further greater than an electrical resistivity of the top electrode material layer 216*m*. In one embodiment, the material of the second buffer material layer 214*m* is the same as the material of the first buffer material layer 210*m*. In alternative embodiments, the material of the second buffer material layer 214*m* is different from the material of the first buffer material layer 210*m*.

The top electrode material layer 216*m* is formed on and in contact with the second buffer material layer 214*m*, for example. In some embodiments, the second buffer material layer 214*m* is sandwiched between (e.g., in physical contact with) the storage element material layer 212*m* and the top electrode material layer 216*m*. In some embodiments, the top electrode material layer 216*m* includes a conductive material, such as Ti, Co, Cu, AlCu, W, TiN, TiW, TiAl, TiAlN, or a combination thereof. The top electrode material layer 216*m* and the bottom electrode 208 may have the same material or different materials. For example, the top electrode material layer 216*m* and the bottom electrode 208 are both made of TiN. For another example, the top electrode material layer 216*m* and the bottom electrode 208 are both made of W. However, the disclosure is not limited thereto. In one embodiment, the top electrode material layer 216*m* is TiN while the bottom electrode 208 are both made of W, or vice versa. The top electrode material layer 216*m* may be formed by any suitable method, such as CVD, PVD, or the like. The top electrode material layer 216*m* may have a thickness of about 10 nm to about 20 nm.

The first hard mask material layer 218*m* is formed on and in contact with the top electrode material layer 216*m*, for example. In some embodiments, the top electrode material layer 216*m* is sandwiched between (e.g., in physical contact with) the second buffer material layer 214*m* and the first hard mask material layer 218*m*. In some embodiments, the first hard mask material layer 218*m* includes an inorganic dielectric material, such as SiON, SiN, SiC, SiOC, SiCN, or a combination thereof. The first hard mask material layer 218*m* may be formed by any suitable method, such as CVD. The first hard mask material layer 218*m* may have a thickness of about 20 nm to about 50 nm.

Continued on FIG. 2, in some embodiments, after the formation of the stack structure, a photoresist layer 50 is then formed over the stack structure (e.g., disposed on the first hard mask material layer 218*m*). In some embodiments, the photoresist layer 50 is overlapped with the bottom electrode 208 in projection on the first interconnect structure 110 along a stacking direction of the stack structure. The photoresist layer 50 may be a tri-layer structure, which may include a first photoresist material layer 52*m*, a second photoresist material layer 54*m* and a photoresist pattern 56, as shown in FIG. 2. In the case, the first photoresist material layer 52*m*, the second photoresist material layer 54*m* and the photoresist pattern 56 are at least disposed over and cover a part of the bottom electrode 208. However, the disclosure is not limited thereto; alternatively, the photoresist layer 50 may have a single-layer structure, such as a layer of or being similar to the photoresist pattern 56.

The first photoresist material layer 52*m* is formed on and in contact with the first hard mask material layer 218*m*, for example. The first photoresist material layer 52*m* may be formed over the top electrode material layer 216*m* and may be utilized for critical dimension control in order to obtain and control the desired dimensions of the patterning of the top electrode material layer 216*m* (not shown in FIG. 2 but illustrated and discussed below with respect to FIGS. 5-6). In some embodiments, a material of the first photoresist material layer 52*m* includes amorphous carbon formed by a CVD process, although other suitable materials and methods of formation may alternatively be utilized. The first photoresist material layer 52*m* may be formed to a thickness of between about 80 nm and about 150 nm.

The second photoresist material layer 54*m* is formed on and in contact with the first photoresist material layer 52*m*, for example. The first photoresist material layer 52*m* is sandwiched between (e.g., in physical contact with) the first hard mask layer 218*m* and the second photoresist material layer 54*m*. The second photoresist material layer 54*m* may be a hard mask utilized to help pattern the first photoresist material layer 52*m*, and may be a masking material such as silicon oxynitride (SiON), although other suitable materials, such as silicon oxide or silicon nitride, may alternatively be utilized, and may be formed a process such as CVD. However, any other suitable processes and thicknesses may alternatively be utilized. The second photoresist material layer 54*m* may be formed to a thickness of between about 30 nm and about 50 nm.

The photoresist pattern 56 is formed on and in contact with the second photoresist material layer 54*m*, for example. As shown in FIG. 2, the photoresist pattern 56 may correspond to the bottom electrode 208. That is, the photoresist pattern 56 is disposed directly on the bottom electrode 208, for example. The photoresist pattern 56 may be formed by any suitable method, such as spin-coating and photolithography processes, or the like. For example, a material of the photoresist pattern 56 includes a positive resist material or a negative resist material, that is suitable for a patterning process such as a photolithography process with a mask or a mask-less photolithography process (for instance, an electron-beam (e-beam) writing or an ion-beam writing). The photoresist pattern 56 may have a thickness of about 50 nm to about 80 nm.

Figure 3:
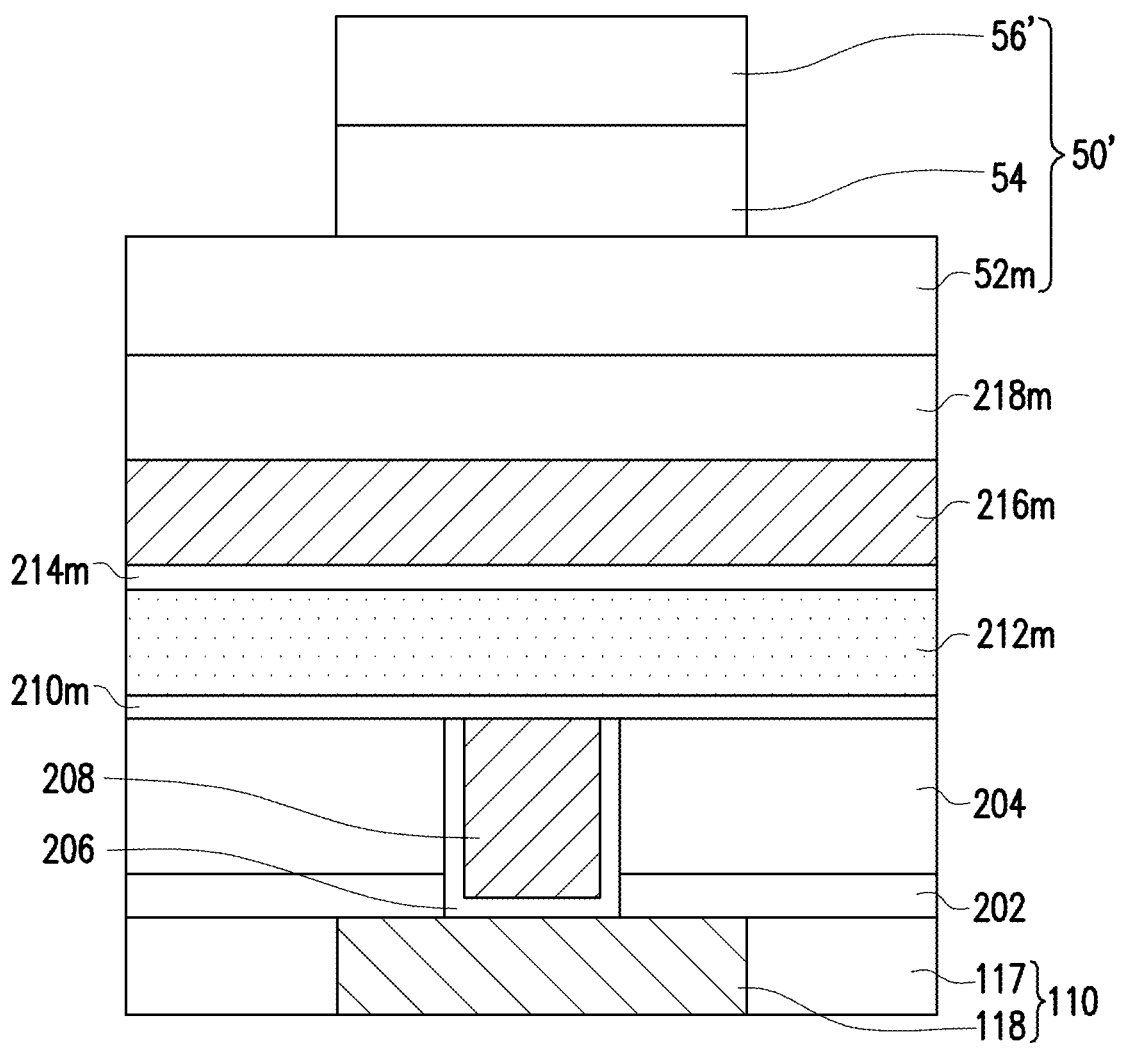

Referring to FIG. 2 and FIG. 3, in some embodiments, the second photoresist material layer 54*m* is patterned by using the photoresist pattern 56 as a mask. In the case, as shown in FIG. 3, a portion of the second photoresist material layer 54*m* is removed to form a second hard mask layer 54, where the first photoresist material layer 52*m* is exposed by the second hard mask layer 54 and the photoresist pattern 56' thereon. The photoresist pattern 56' may be consumed during the patterning, thus the photoresist pattern 56' may have a thickness less than the thickness of the photoresist pattern 56. The patterning process may include an etching process, such as a dry etching, a wet etching or a combination thereof. After patterning the second photoresist material layer 54*m*, the photoresist layer 50' includes the first photoresist material layer 52*m*, the second hard mask layer 54 and the photoresist pattern 56', as shown in FIG. 3, for example.

Figure 4:
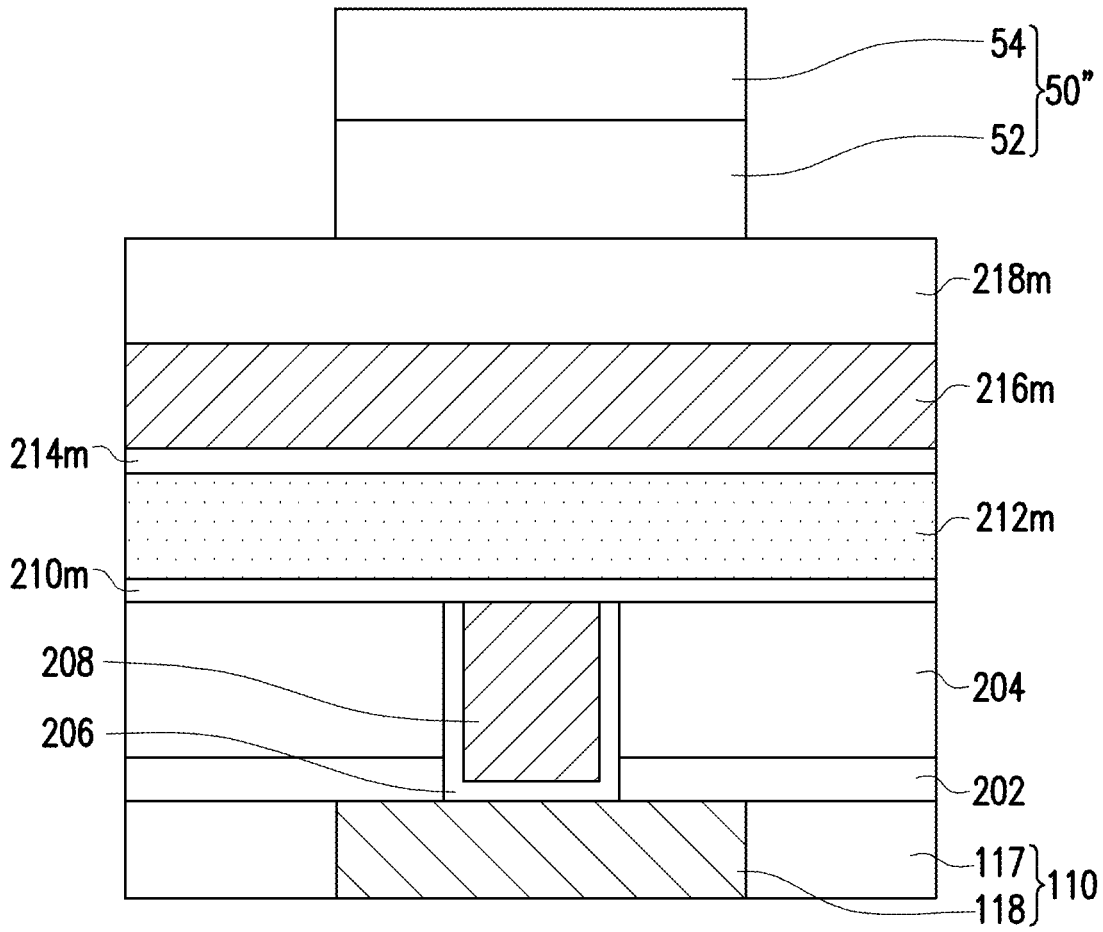

Referring to FIG. 3 and FIG. 4, in some embodiments, the first photoresist material layer 52*m* is patterned by using the second hard mask layer 54 as a mask. In the case, as shown in FIG. 4, a portion of the first photoresist material layer 52*m* is removed to form an anti-reflective deposition (ARD) layer 52, where the first hard mask material layer 218*m* is exposed by the ARD layer 52 and the second hard mask layer 54 thereon. The photoresist pattern 56' may be removed during the patterning. The patterning process may include ashing process, such as using O$_2$ ashing, N$_2$ ashing, H$_2$ ashing, or the like. After patterning the first photoresist material layer 52*m*, the photoresist layer 50'' includes the ARD layer 52 and the second hard mask layer 54, as shown in FIG. 4, for example.

Figure 5:
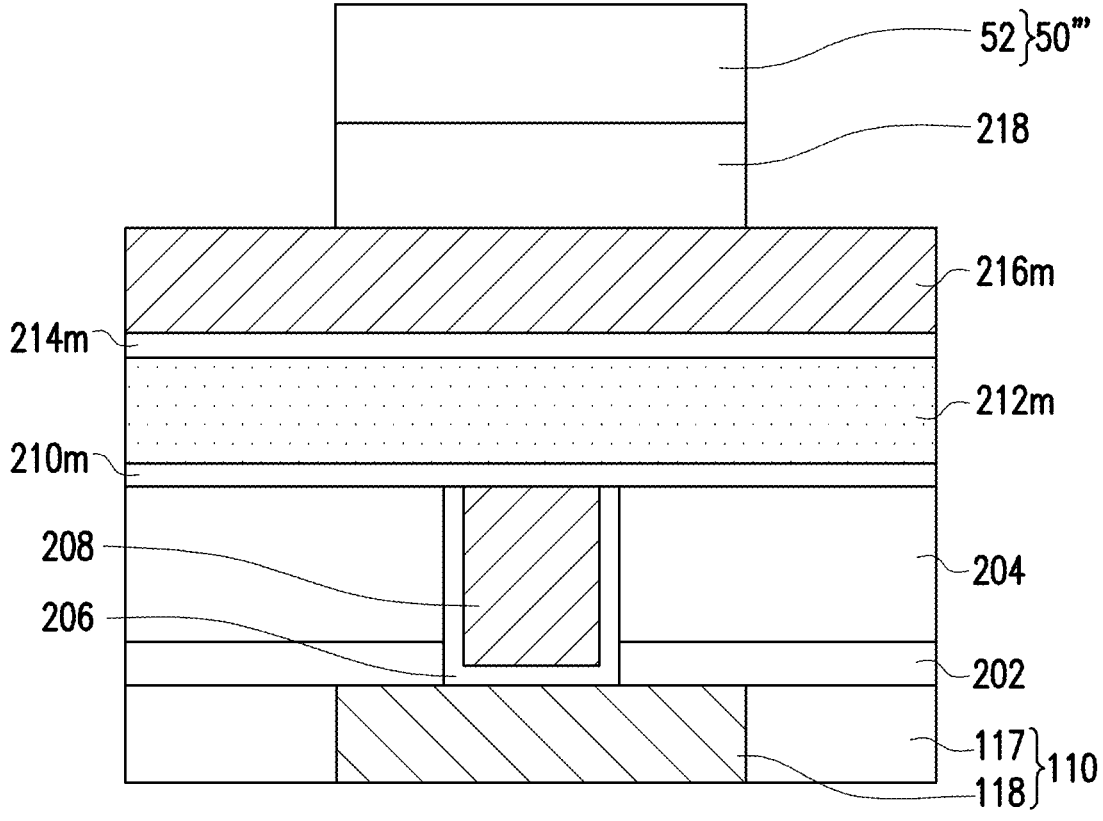
Figure 6:
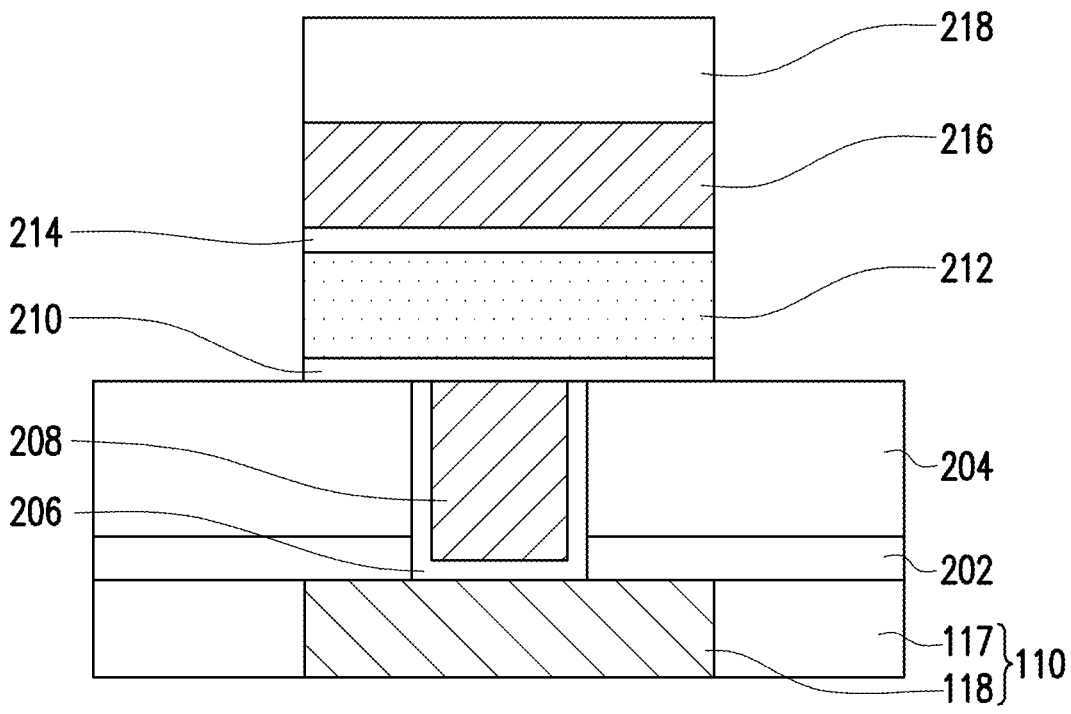

Referring to FIG. 4 through FIG. 6, in some embodiments, the stack structure is patterned. In FIG. 4 and FIG. 5, in some embodiments, the first hard mask material layer 218*m* is patterned by using the ARD layer 52 as a mask. In the case, as shown in FIG. 5, a portion of the first hard mask material layer 218*m* is removed to form a first hard mask layer 218, where the top electrode material layer 216*m* is exposed by the ARD layer 52 and the first hard mask layer 218 thereon. The second hard mask layer 54 may be removed during the patterning. After patterning the first hard mask material layer 218*m*, the photoresist layer 50''' includes the ARD layer 52, as shown in FIG. 5, for example. The patterning process may include an etching process, such as a dry etching, a wet etching or a combination thereof.

In FIG. 5 and FIG. 6, in some embodiments, the top electrode material layer 216*m*, the second buffer material layer 214*m*, the storage element material layer 212*m* and the first buffer material layer 210*m* are sequentially patterned by using the first hard mask layer 218 as a mask. In the case, as shown in FIG. 6, a portion of the top electrode material layer 216*m* is removed to form a top electrode 216, a portion of the second buffer material layer 214m is removed to form a second buffer layer 214, a portion of the storage element material layer 212m is removed to form a storage element layer 212, and a portion of the first buffer material layer 210m is removed to form a first buffer layer 210. A portion of the first interconnect structure 110 is exposed by the first buffer layer 210, the storage element layer 212, the second buffer layer 214, the top electrode 216, and the first hard mask layer 218. The storage element layer 212 may be referred to as a memory layer of the memory cell 200.

The ARD layer 52 may be removed during the patterning. The patterning process may include a plurality of etching process, each may be a dry etching, a wet etching or a combination thereof. As illustrate in FIG. 6, sidewalls of the first buffer layer 210, the storage element layer 212, the second buffer layer 214, the top electrode 216 and the first hard mask layer 218 may be substantially aligned with one another within the process variations. Owing to the material properties of the first buffer layer 210 and the second buffer layer 214, the abilities of heat dissipation of the first buffer layer 210 and the second buffer layer 214 are less as compared with the bottom electrode 208, the storage element layer 212 and the top electrode 216; such that, the first buffer layer 210 and the second buffer layer 214 may be considered as thermal insulating layers or heat storage layers of the storage element layer 212, sometimes.

Referring to FIG. 7, in some embodiments, a protection layer 220 is formed over the structure depicted in FIG. 6. The protection layer 220 may be completely disposed on the first hard mask layer 218 and the first interconnect structure 110 exposed by the first hard mask layer 218 and its underlying layers, and may further completely cover the sidewalls of the first buffer layer 210, the storage element layer 212, the second buffer layer 214, the top electrode 216 and the first hard mask layer 218, as shown in FIG. 7. In some embodiments, the protection layer 220 extends continuously from a top surface of the first hard mask layer 218 to the exposed top surface of the first interconnect structure 110. In the case, the protection layer 220 is continuously in contact with the sidewalls of the first buffer layer 210, the storage element layer 212, the second buffer layer 214, the top electrode 216 and the first hard mask layer 218. That is, for example, the protection layer 220 laterally encloses each of the first buffer layer 210, the storage element layer 212, the second buffer layer 214, the top electrode 216, and the first hard mask layer 218. The protection layer 220 includes, for example, silicon nitride, silicon oxide, silicon oxynitride, silicon carbide, carbon-doped silicon nitride, carbon-doped silicon oxide, carbon-doped silicon oxynitride, or a combination thereof. In some embodiments, the protection layer 220 is deposited by using processes such as CVD (e.g., high density plasma (HDP) CVD or sub-atmospheric CVD (SACVD)), ALD, molecular layer deposition (MLD), or other suitable methods. The protection layer 220 functions as a protection layer that effectively blocks water or moisture from penetrating into the storage element layer 212. The protection layer 220 may have a thickness of about 10 nm to about 20 nm.

Thereafter, an insulating layer 122 is formed over the protection layer 220, in some embodiments. For example, the insulating layer 122 is referred to as an IMD layer which includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The insulating layer 122 may be formed by any suitable method, such as CVD. The formation and material of the insulating layer 122 may be substantially identical or similar to the formation and material of the insulating layer 117 previously described in FIG. 1, and thus are not repeated herein for brevity.

A conductive via 124 is then formed in the insulating layer 122 to electrically couple to the top electrode 216 by penetrating through the protection layer 220 and the first hard mask layer 218, for example, as shown in FIG. 7. In some embodiments, the conductive via 124 is formed by a single damascene process including following steps. First, an opening OP2 is formed in the insulating layer 122, the protection layer 220 and the first hard mask layer 218. The opening OP2 penetrates though the insulating layer 122, the protection layer 220 and the first hard mask layer 218 to reach the top electrode 216 by accessibly reveal at least a part of a top surface of the top electrode 216. The protection layer 220, sometimes, may be referred to as an etching stop layer or contact etch stop layer (CESL) to prevent the top electrode 216 is damaged caused by over-etched during the formation of the opening OP2. Then, the opening OP2 is filled with a conductive material, where the conductive material is in physical contact with the exposed top surface of the top electrode 216. After that, a planarization process (e.g., a CMP process) is performed to remove excessive conductive material over a plane including a top surface of the insulating layer 122, thereby forming the conductive via 124. In some embodiments, the conductive via 124 includes metals or metal alloys including one or more of Al, AlCu, Cu, Ti, TiN, W, or the like. One or more than one conductive via 124 may be formed, the disclosure is not limited to the drawing of FIG. 7. In some embodiments, a top surface of the conductive via 124 is substantially coplanar with the top surface of the insulating layer 122 within the process variations.

In some embodiments, an insulating layer 126 and a conductive layer 128 are formed over the insulating layer 122 and the conductive via 124. As shown in FIG. 7, the conductive layer 128 may be electrically coupled to the top electrode 216 through the conductive via 124. For example, the insulating layer 126 is referred to as an IMD layer. The formation and material of the insulating layer 126 may be substantially identical or similar to the formation and material of the insulating layer 117 previously described in FIG. 1, the formation and material of the conductive layer 128 may be substantially identical or similar to the formation and material of the conductive layer 118 previously described in FIG. 1, and thus are not repeated herein for brevity. The insulating layer 122, the conductive via 124, the insulating layer 126 and the conductive layer 128 may constitute a second interconnect structure 120 as shown in FIG. 7. However, the disclosure is not limited thereto; alternatively, the conductive via 124 and the conductive layer 128 may be formed by a dual damascene process, instead.

As shown in FIG. 7, the semiconductor device 10 with the memory cell 200 is accomplished after forming the conductive layer 128. Specifically, the memory cell 200 may include the bottom electrode 208, the top electrode 216, the storage element layer 212 between the bottom and top electrodes 208 and 216, the first buffer layer 210 between the bottom electrode 208 and the storage element layer 212, the second buffer layer 214 between the storage element layer 212 and the top electrode 216, and the protection layer 220 covering the top electrode 216 and its underlying layers. The memory cell 200 may further include the first hard mask layer 218 on the top electrode 216 and the barrier layer 206 underlying the bottom electrode 208, where the protection layer 220 may further cover the first hard mask layer 218, and the first buffer layer 210 may further cover the barrier layer 206. The first hard mask layer 218 is sandwiched between the protection layer 220 and the top electrode 216, and the barrier layer 206 is sandwiched between the bottom electrode 208 and the conductive layer 118, for example.

In some embodiments, the storage element layer 212 is a phase change material layer (hereinafter referred to as the PCM layer 212) when the memory cell 200 is a PCM cell, the PCM layer 212 has a variable phase representing a data bit. For example, the PCM layer 212 has a crystalline phase and an amorphous phase which are interchangeable. The crystalline phase and the amorphous phase may respectively represent a binary "1" and a binary "0", or vice versa. Accordingly, the PCM layer 212 has a variable resistance that changes with the variable phase of the PCM layer 212. For example, the PCM layer 212 has a high resistance in the amorphous phase and a low resistance in the crystalline phase. Sometimes, the PCM layer 212 may also be referred to as a variable resistance layer.

In the operation of the memory cell 200, the data state of the memory cell 200 is read by measuring the resistance of the memory cell 200 (i.e., the resistance from the bottom electrode 208 to the top electrode 216). The phase of the PCM layer 212 represents the data state of the memory cell 200, the resistance of the PCM layer 212, or the resistance of the memory cell 200. Further, the data state of the memory cell 200 may be set and reset by changing the phase of the PCM layer 212.

In some embodiments, the phase of the PCM layer 212 is changed by heating. For example, the bottom electrode (or heater) 208, through an input current such as a set current "Iset", heats the PCM layer 212 to a first temperature that induces crystallization of the PCM layer 212, so as to change the PCM layer 212 to the crystalline phase (e.g., to set the memory cell 200). Similarly, the bottom electrode (or heater) 208, through an input current such as a reset current "Ireset", heats the PCM layer 212 to a second temperature that melts the PCM layer 212, so as to change the PCM layer 212 to the amorphous phase (e.g., to reset the memory cell 200). The first temperature is lower than the second temperature. In some embodiments, the first temperature is 100° C. to 200° C. and the second temperature is 150° C. to 400° C.

The amount of heat generated by the bottom electrode 208 varies in proportion to the current applied to the bottom electrode 208. That is, the PCM layer 212 is heated up to a temperature (i.e., the second temperature) higher than the melting temperature when a current passes through it. The temperature is then quickly dropped below the crystallization temperature. In the case, a portion of the PCM layer 212 heated by the bottom electrode 208 is changed to the amorphous state with high resistivity, and thus the state of the memory cell 200 is changed to a high resistance state. Then, the portion of the PCM layer 212 may be back to the crystalline state by heating up the PCM layer 212 to a temperature (i.e., the first temperature) higher than the crystallization temperature and lower than the melting temperature, for a certain period.

Based on above, it is known that the PCM layer 212 is a key layer for operating the memory cell 200 via applying different input currents (e.g., Iset and/or Ireset) onto the bottom electrode 208 in order to change the crystallization phases of the PCM layer 212. In the present embodiment, the first buffer layer 210 is sandwiched between the PCM layer 212 and the bottom electrode 208, where the thermal boundary resistance (TBR) between the first buffer layer 210 and the PCM layer 212 is increased. With that, the PCM layer 212 is able to reach at a certain temperature (e.g., the first or second temperature) for a certain crystallization phase (e.g., the amorphous or crystalline state) while lowering an input current applied to the bottom electrode 208, thereby operating the memory cell 200. In the case, only a small input current is needed to maintain the switchable performance of the memory cell 200 due to the first buffer layer 210 suppresses the heat dissipation of the PCM layer 212 so to help maintaining a temperature of the PCM layer 212, after being heated by the bottom electrode 208. For example, the reset current (Ireset) of the memory cell 200 is lowered than that of a conventional memory cell having no buffer layer(s) therein. In some embodiments, the reset current (Ireset) of the memory cell 200 is, about 20% or more, less than that of the conventional memory cell. Moreover, since the small input current is utilized for the memory cell 200, a device density of the memory cell 200 in the semiconductor device 10 can be increased in a given area without violating the design requirement/constrain (e.g., relevant to the voltage or current overloading issue), thereby improving the performance of the semiconductor device 10 having the memory cell 200 as compared to a semiconductor device having the conventional memory cell.

Although only one memory cell 200 is shown in the semiconductor device 10 of FIG. 7 for illustrative purpose, the disclosure is not limited thereto. The number of the memory cell may be one or more than one depending on the design requirement and demand. FIG. 8 through FIG. 20 are respectively schematic sectional views of a memory cell in accordance with some other embodiments of the disclosure. In some embodiments, the memory cell 200 included in the semiconductor device 10 may be substituted by any one of memory cells 200a-200m respectively depicted in FIG. 8 to FIG. 20.

Figure 8:
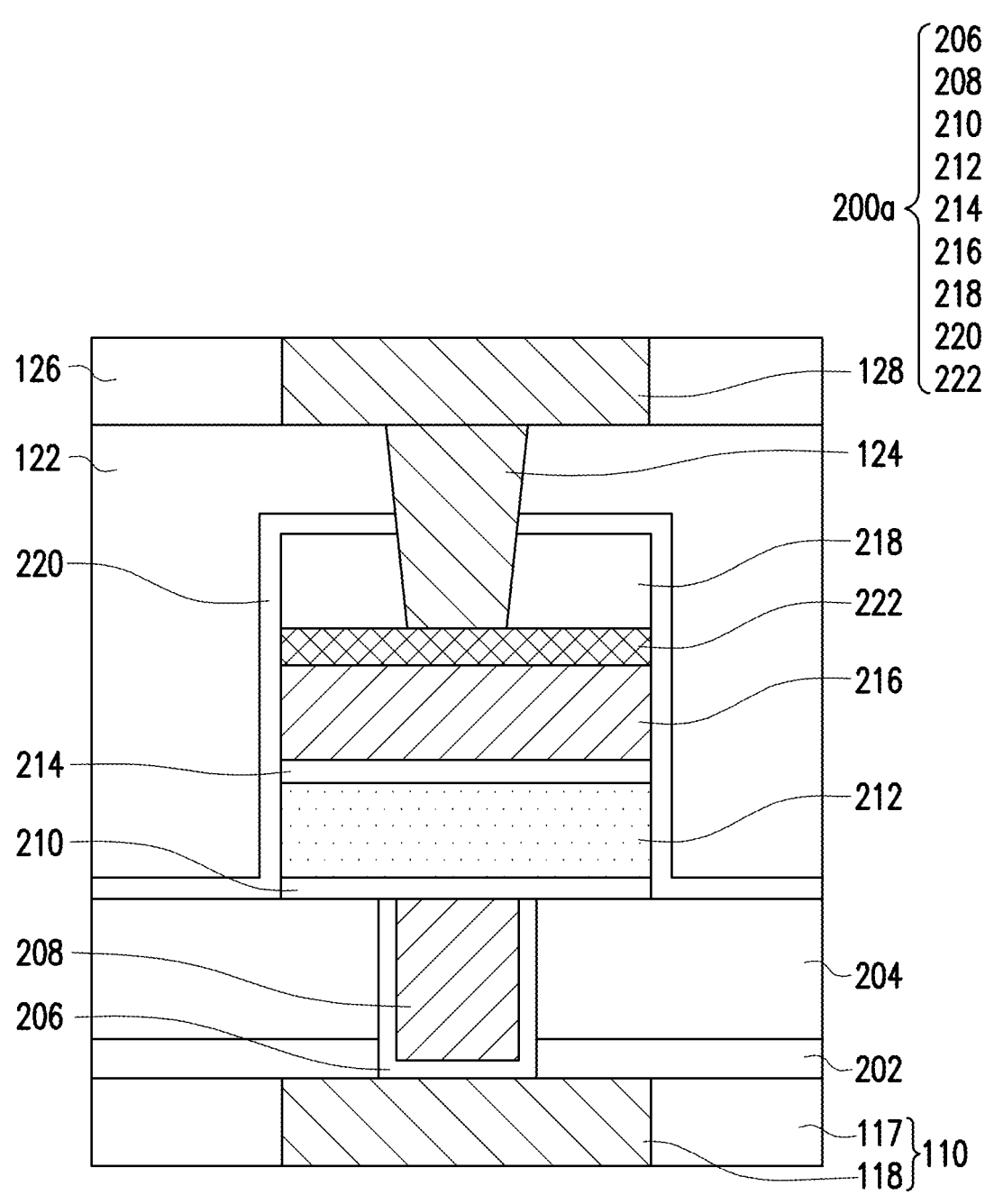
FIG. 8 through FIG. 20 are respectively schematic sectional views of a memory cell in accordance with some other embodiments of the disclosure.

Referring to FIG. 8, in some embodiments, the memory cell 200a is similar to the memory element 200 of FIG. 7; that is, the structures, materials, and functions of the memory element 200a are similar to those of the memory element 200, and thus the details are omitted herein. The main difference between the memory element 200a and the memory element 200 lies in that the memory cell 200a further includes a selector 222 interposed between the first hard mask layer 218 and the top electrode 216. As shown in FIG. 8, sidewalls of the selector 222 are substantially aligned with the sidewalls of the first hard mask layer 218, the top electrode 216, the second buffer layer 214, the storage element layer 212 and the first buffer layer 210 within the process variations. For example, the protection layer 220 may cover the sidewalls of the selector 222. In some embodiments, the selector 222 includes an ovonic threshold switch (OTS) material while the top electrode 216 includes W, WN, or Ru. The OTS material may include a chalcogenide material that is responsive to an applied voltage across the selector 222. For an applied voltage that is less than a threshold voltage, the selector 222 remains in an "off" state, e.g., an electrically nonconductive state. Alternatively, responsive to an applied voltage across the selector 222 that is greater than the threshold voltage, the selector 222 enters an "on" state, e.g., an electrically conductive state. That is, the selector 222 is referred to as a switch for determining to turn on or turn off the memory cell 200a, sometimes.

Figure 9:
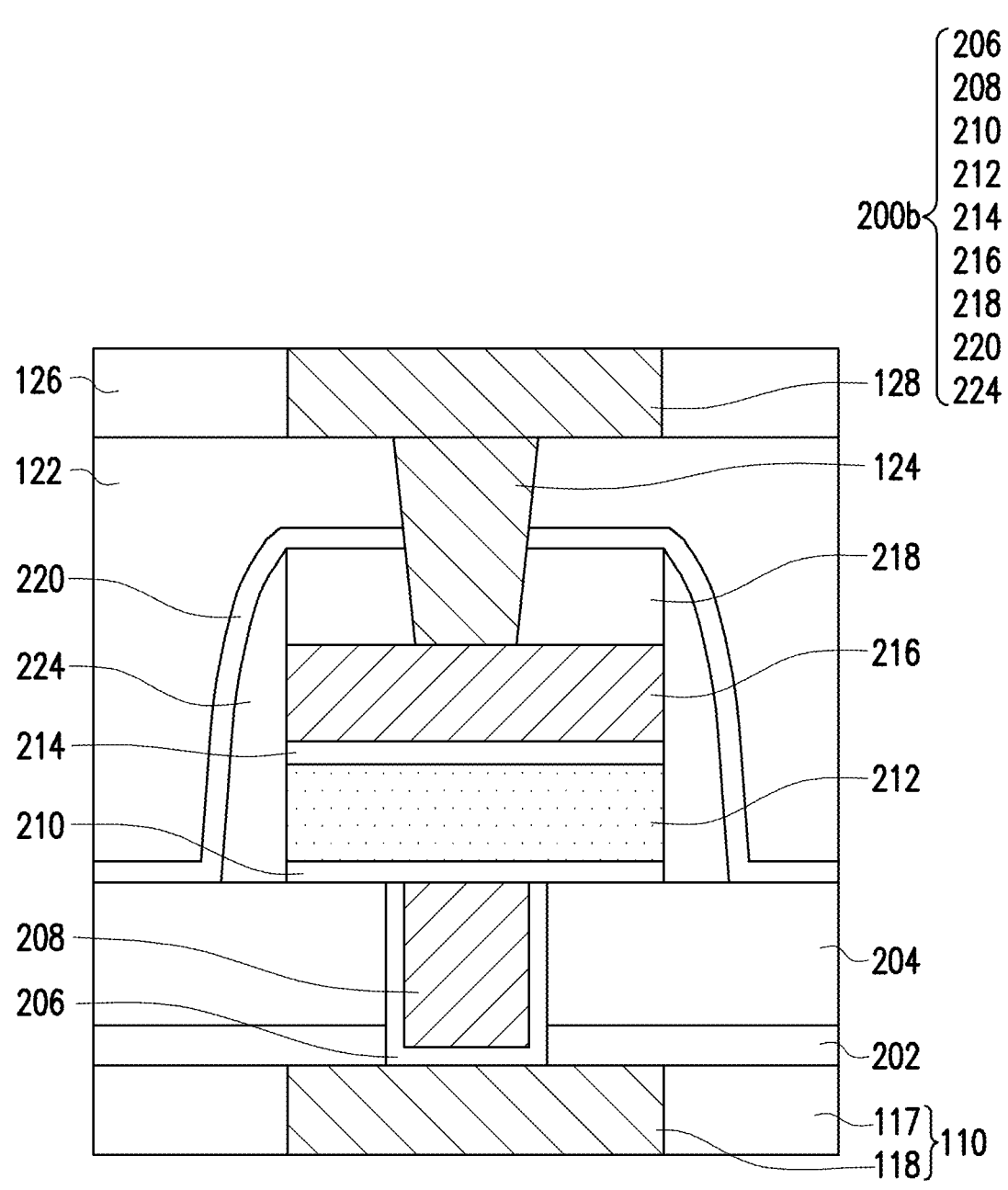

Referring to FIG. 9, in some embodiments, the memory cell 200b is similar to the memory element 200 of FIG. 7; that is, the structures, materials, and functions of the memory element 200b are similar to those of the memory element 200, and thus the details are omitted herein. The main difference between the memory element 200b and the memory element 200 lies in that the memory cell 200b further includes dielectric spacers 224 at the sidewalls of the first buffer layer 210, the storage element layer 212, the second buffer layer 214, the top electrode 216, and the first hard mask layer 218. As shown in FIG. 9, the dielectric spacers 224 may continuously extend along the sidewalls of the first hard mask layer 218, the top electrode 216, the second buffer layer 214, the storage element layer 212, and the first buffer layer 210. In some embodiments, the dielectric spacers 224 can provide further physical protection to the memory element 200b, such as effectively blocks water or moisture from penetrating into the storage element layer 212. Alternatively, the memory cell 200b may further adopt a selector as discussed in FIG. 8 above.

In some embodiments, the dielectric spacers 224 are formed by depositing a spacer layer (not shown) over and around the first hard mask layer 218, the top electrode 216, the second buffer layer 214, the storage element layer 212 and the first buffer layer 210 before the formation of the protection layer 220. For example, the spacer layer is deposited by a deposition technique (e.g., PVD, CVD, PECVD (plasma-enhanced chemical vapor deposition), ALD, sputtering, etc.) to a desired thickness. Thereafter, the spacer layer is etched to remove the spacer layer from horizontal surfaces, leaving the dielectric spacers 224 along opposing sides of the first buffer layer 210, the storage element layer 212, the second buffer layer 214, the top electrode 216, and the first hard mask layer 218. In various embodiments, the dielectric spacer 224 may comprise a nitride (e.g., silicon nitride or silicon oxy-nitride), an oxide (e.g., silicon dioxide), or the like.

In the above embodiments, the first and second buffer layers 210 and 214 are both included in the memory cell 200, 200a and 200b; the disclosure is not limited thereto. In the disclosure, the second buffer layer 214 may be omitted.

Figure 10:
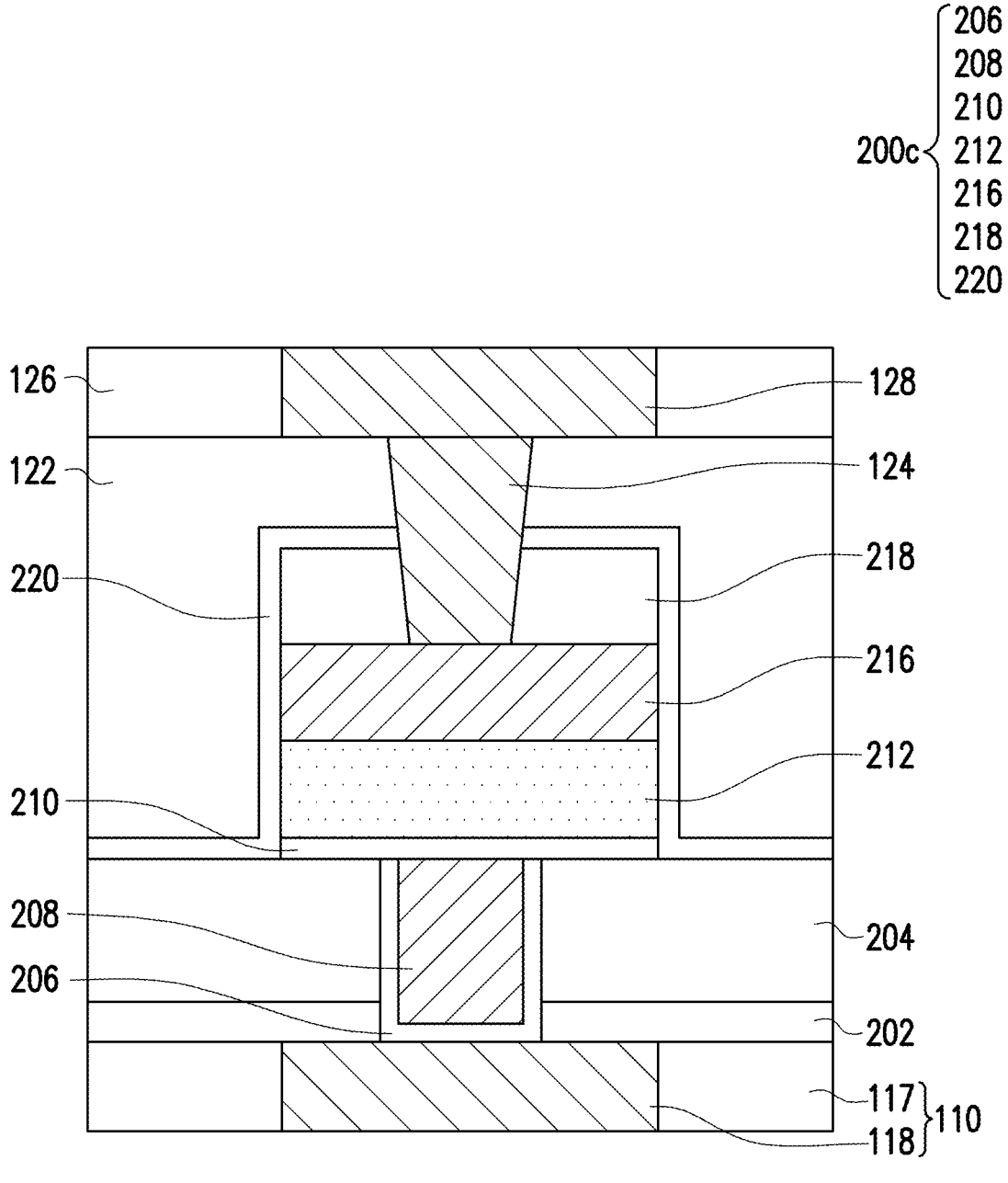

Referring to FIG. 10, in some embodiments, the memory cell 200c is similar to the memory element 200 of FIG. 7; that is, the structures, materials, and functions of the memory element 200c are similar to those of the memory element 200, and thus the details are omitted herein. The main difference between the memory element 200c and the memory element 200 lies in that the memory cell 200c excludes the second buffer layer 214 between the top electrode 216 and the storage element layer 212. With such configuration, an overall thickness of the memory cell 200c is reduced. In addition, owing to the first buffer layer 210, the memory cell 200c is still able to be operated with a lowering input current applied onto the bottom electrode 208 as similar to the operation of the memory cell 200 as discussed above.

Figure 11:
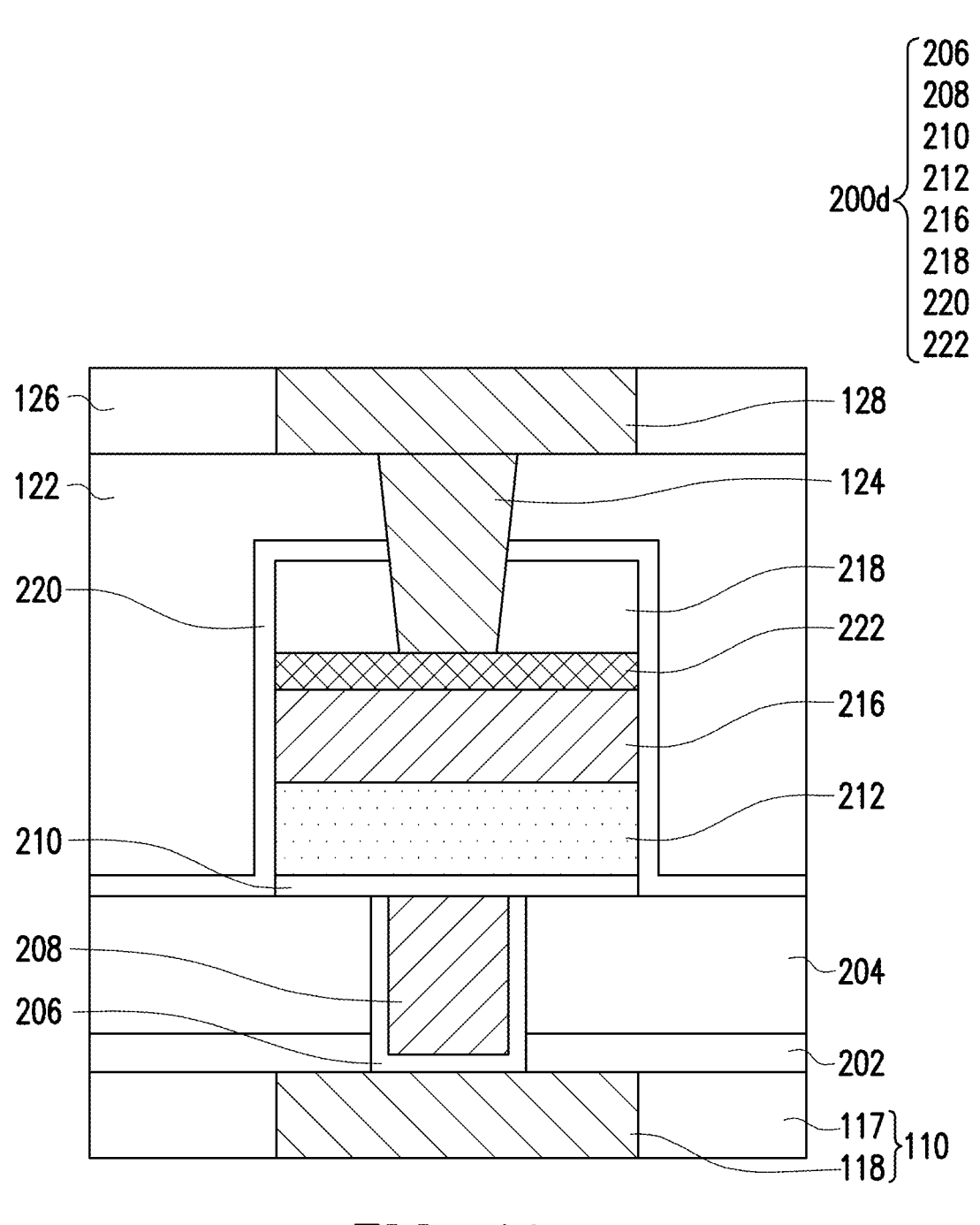
Figure 12:
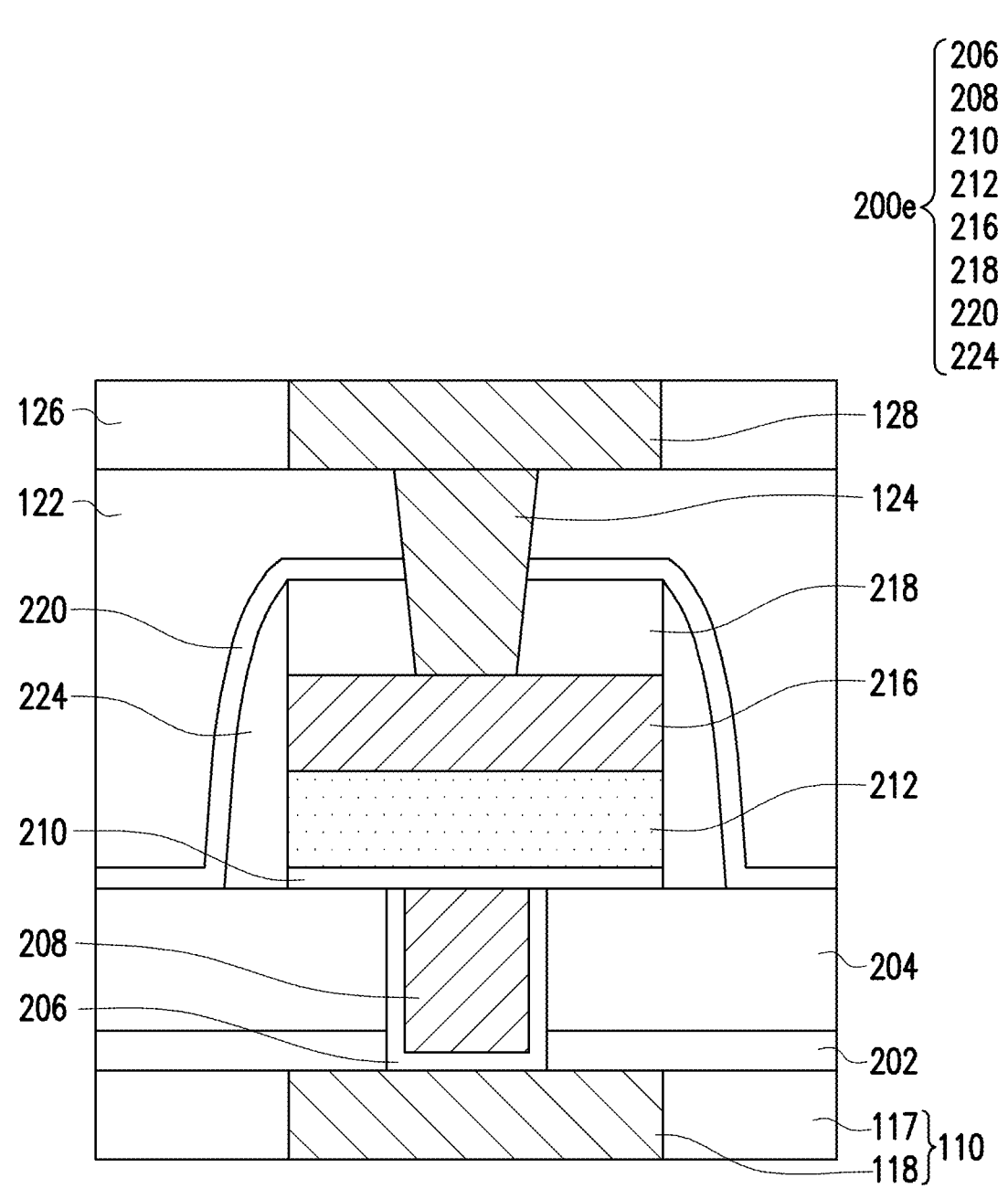

Similarly, the memory cell 200a may exclude the second buffer layer 214 (e.g., a memory cell 200d depicted in FIG. 11). Alternatively, the memory cell 200b may exclude the second buffer layer 214 (e.g., a memory cell 200e depicted in FIG. 12). The disclosure is not limited thereto. In one embodiment, the memory cell 200e may further adopt a selector as discussed in FIG. 8 above.

In the above embodiments, the first buffer layer 210 and the storage element layer 212 are directly disposed on the top surface S204t of the second dielectric layer 204 to contact with the bottom electrode 208. In the case, the top surface S204t of the second dielectric layer 204 is substantially coplanar to the top surface S208t of the bottom electrode 208 and the top surface S206t of the barrier layer 206. However, the disclosure is not limited thereto; alternatively, the top surface S204t of the second dielectric layer 204 may not be coplanar to the top surface S208t of the bottom electrode 208 and the top surface S206t of the barrier layer 206.

Figure 13:
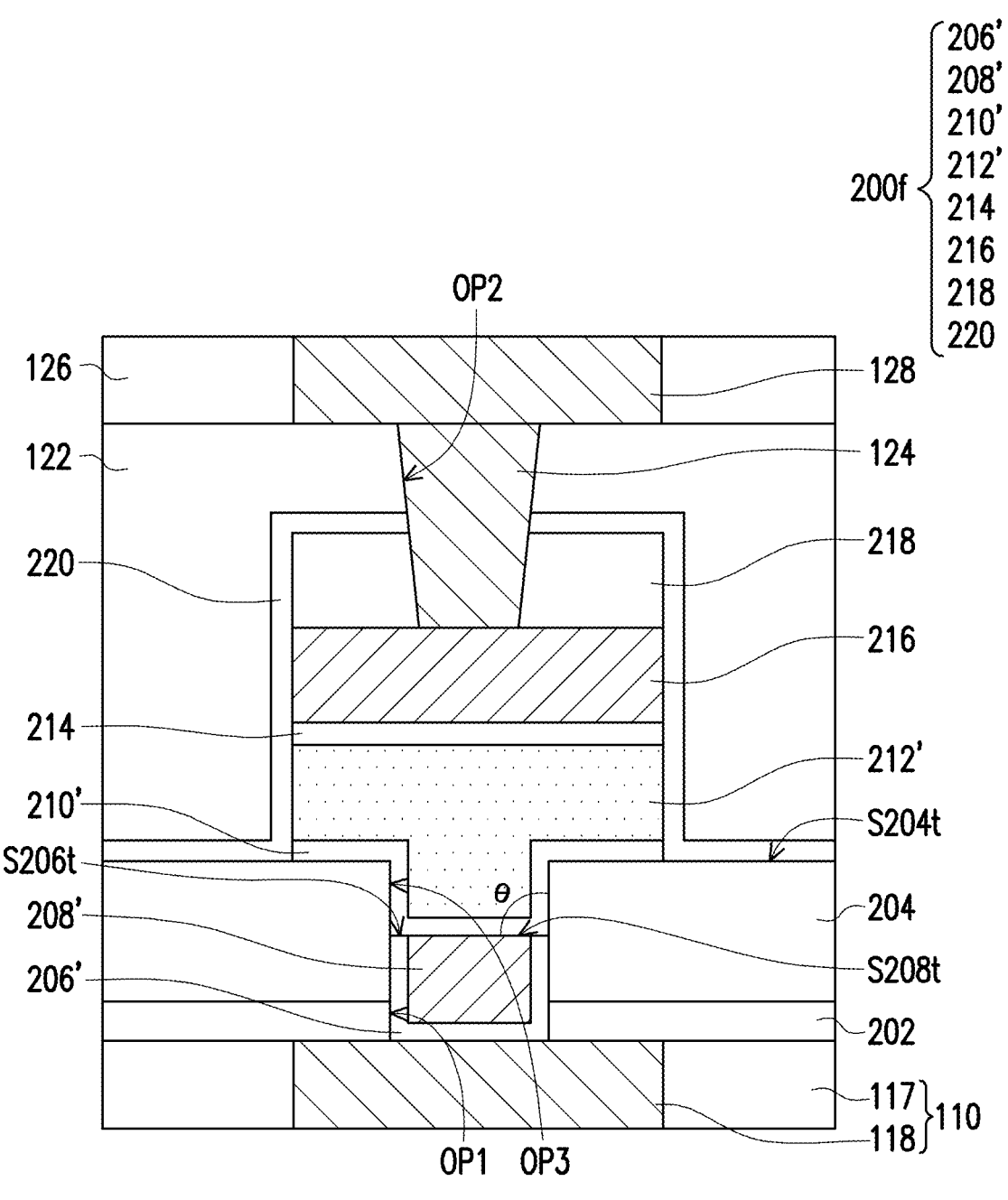

Referring to FIG. 13, in some embodiments, the memory cell 200f is similar to the memory element 200 of FIG. 7; that is, the structures, materials, and functions of the memory element 200f are similar to those of the memory element 200, and thus the same or similar reference numerals are used to refer to the same or liked parts, and its detailed description will be omitted herein. The main difference between the memory element 200f and the memory element 200 lies in that a top surface S208t of a bottom electrode 208' and a top surface S206t of a barrier layer 206' are lower than a top surface S204t of a second dielectric layer 204, where a portion of a first buffer layer 210' and a portion of a storage element layer 212' are extended into the second dielectric layer 204 to contact with the bottom electrode 208'. As shown in FIG. 13, sidewalls of the portion of the first buffer layer 210' extending into the second dielectric layer 204 may be substantially aligned with the sidewalls of the barrier layer 206' within the process variations. In some embodiments, an angle θ between a sidewall and a bottom surface of the opening OP3 is substantially equal to 90 degrees. A bottom surface and sidewalls of the portion of the storage element layer 212' extending into the second dielectric layer 204 may be covered by the portion of the first buffer layer 210' extending into the second dielectric layer 204, such that the portion of the storage element layer 212' is separated from the second dielectric layer 204. In some embodiments, the first buffer layer 210' is interposed between the bottom electrode 208' and the storage element layer 212'. Owing to the first buffer layer 210', the memory cell 200f is still able to be operated with a lowering input current applied onto the bottom electrode 208' as similar to the operation of the memory cell 200 as discussed above.

The formation of the barrier layer 206', the bottom electrode 208', the first buffer layer 210' and the storage element layer 212' may include, but not limited to, the following steps. First, the second dielectric layer 204 is patterned to form an opening OP1 penetrating through a first dielectric layer 202 and the second dielectric layer 204, and the barrier layer 206 and the bottom electrode 208 are formed in the opening OP1 through deposition and CMP processes (similar to FIG. 1). Then, the barrier layer 206 and the bottom electrode 208 located in the opening OP1 are patterned to form the barrier layer 206' and the bottom electrode 208' exposed by an opening OP3 in the second dielectric layer 204 through an etching-back process. As shown in FIG. 13, the top surface S208t of the bottom electrode 208' and the top surface S206t of the barrier layer 206' may be exposed by the opening OP3 and be lower than the top surface S204t of the second dielectric layer 204. After that, a stack structure is formed over the second dielectric layer 204, the barrier layer 206' and the bottom electrode 208' (similar to FIG. 2). Then, the processes previously described in FIG. 3 through FIG. 7 are performed to form the memory cell 200f. As shown in FIG. 13, the first buffer layer 210' may be a conformal layer formed over the second dielectric layer 204 and further extended into the opening OP3 to contact the barrier layer 206' and the bottom electrode 208', and the storage element layer 212' may further fill up the opening OP3 and extend over the top surface S204t of the second dielectric layer 204.

Figure 14:
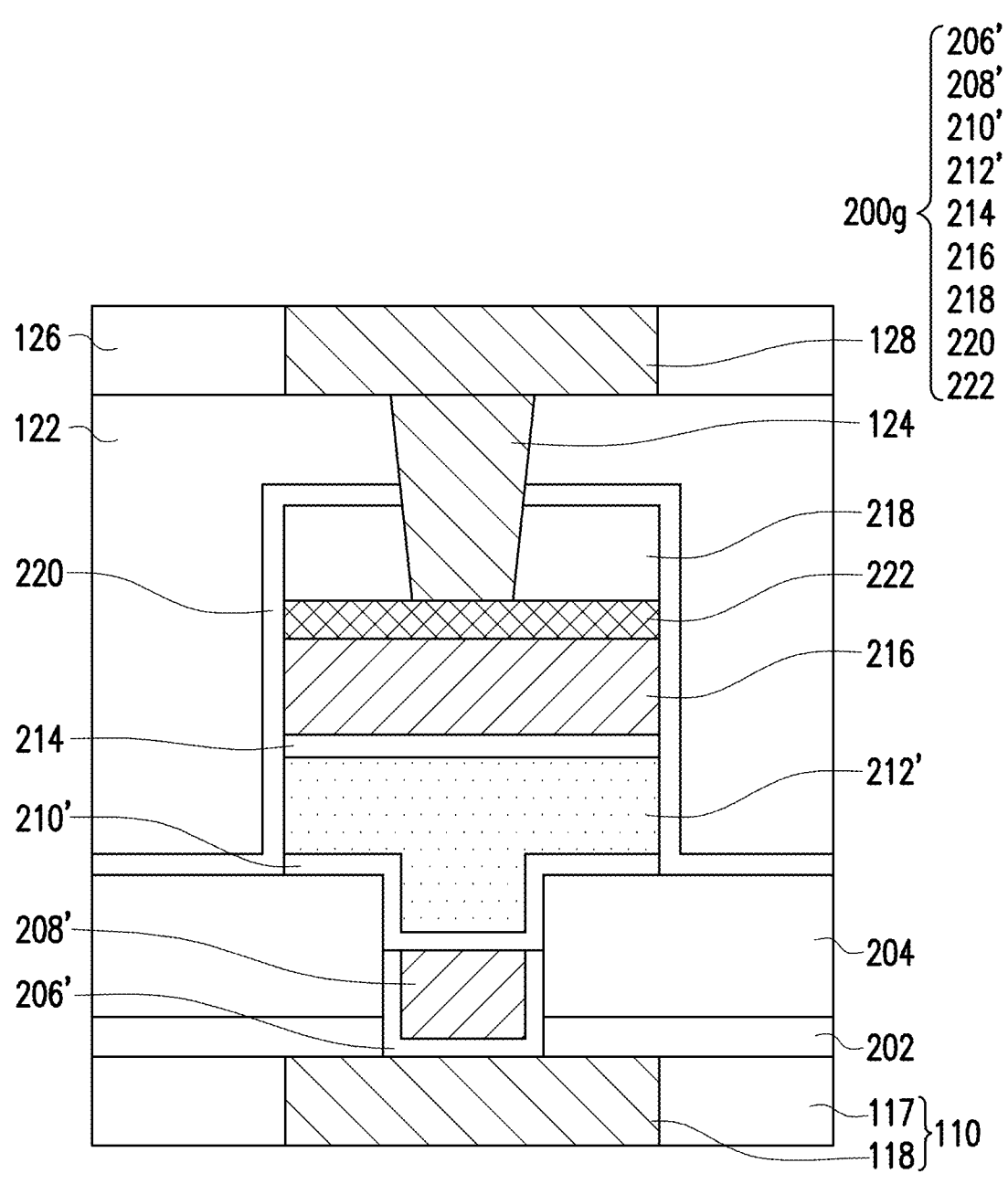

Referring to FIG. 14, in some embodiments, the memory cell 200g is similar to the memory element 200f of FIG. 13; that is, the structures, materials, and functions of the memory element 200g are similar to those of the memory element 200f, and thus the details are omitted herein. The main difference between the memory element 200g and the memory element 200f lies in that the memory cell 200g further includes a selector 222 interposed between the first hard mask layer 218 and the top electrode 216. The details (e.g., the formation, material, thickness, configuration or the like) of the selector 222 have been described in FIG. 8, and thus are not repeated herein.

Figure 15:
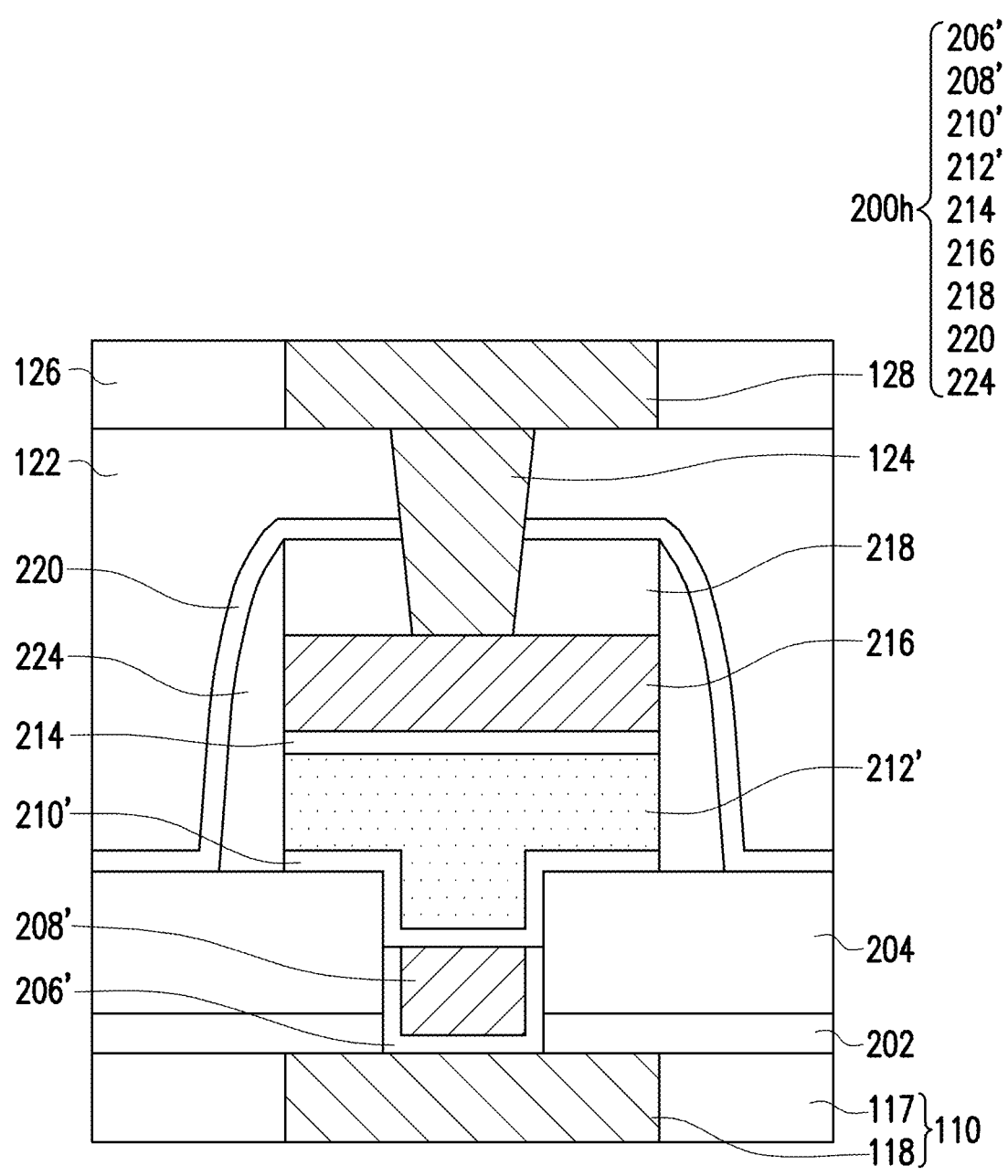

Referring to FIG. 15, in some embodiments, the memory cell 200h is similar to the memory element 200f of FIG. 13; that is, the structures, materials, and functions of the memory element 200h are similar to those of the memory element 200f, and thus the details are omitted herein. The main difference between the memory element 200h and the memory element 200f lies in that the memory cell 200h further includes dielectric spacers 224 at sidewalls of the first buffer layer 210', the storage element layer 212', the second buffer layer 214, the top electrode 216 and the first hard mask layer 218. The details (e.g., the formation, material, thickness, configuration or the like) of the dielectric spacers 224 have been described in FIG. 9, and thus are not repeated herein. Alternatively, the memory cell 200h may further adopt a selector as discussed in FIG. 8 above.

Figure 16:
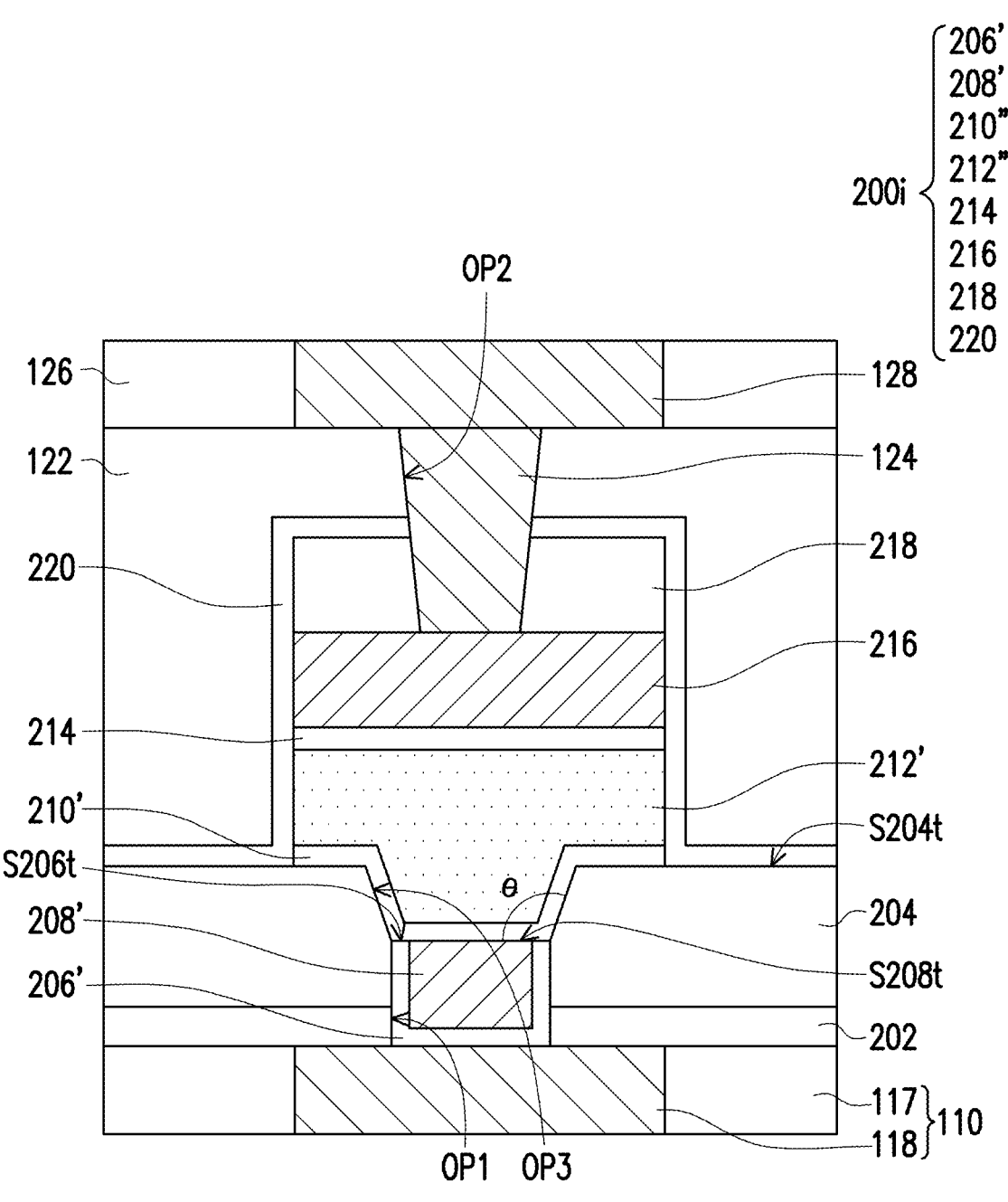

Referring to FIG. 16, in some embodiments, the memory cell 200i is similar to the memory element 200f of FIG. 13; that is, the structures, materials, and functions of the memory element 200i are similar to those of the memory element 200f, and thus the details are omitted herein. The main difference between the memory element 200i and the memory element 200f lies in that the angle θ of the opening OP3 in the memory cell 200i is greater than 90 degrees. In some embodiments, the angle θ is approximately ranging from 90 degrees to 150 degrees. Alternatively, the memory cell 200i may further adopt a selector 222 as discussed in FIG. 8 above, dielectric spacers 224 as discussed in FIG. 9 or a combination thereof. In addition, the memory cell 200i may exclude the second buffer layer 214 (e.g., a memory cell 200m depicted in FIG. 20).

Figure 17:
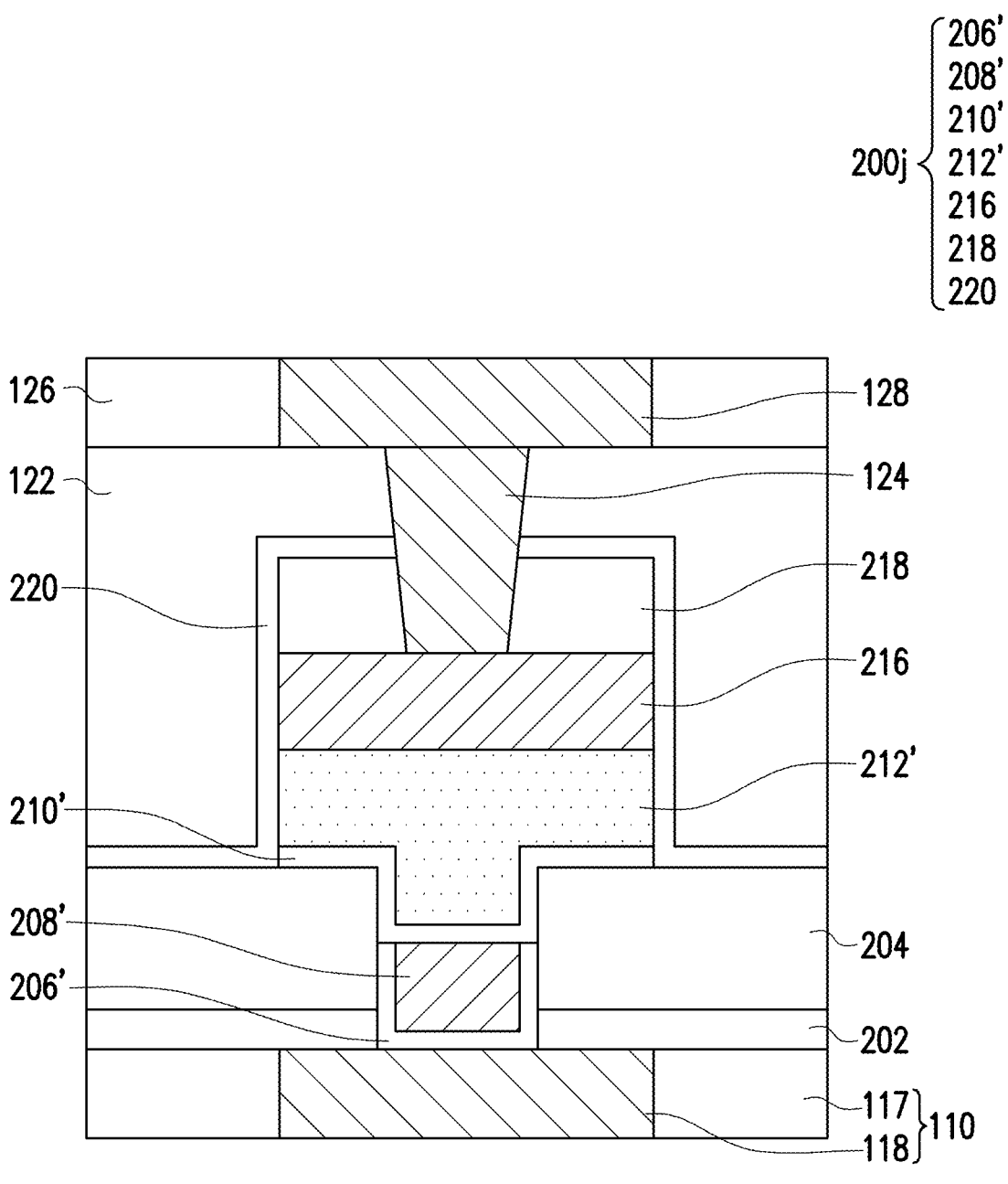
Figure 18:
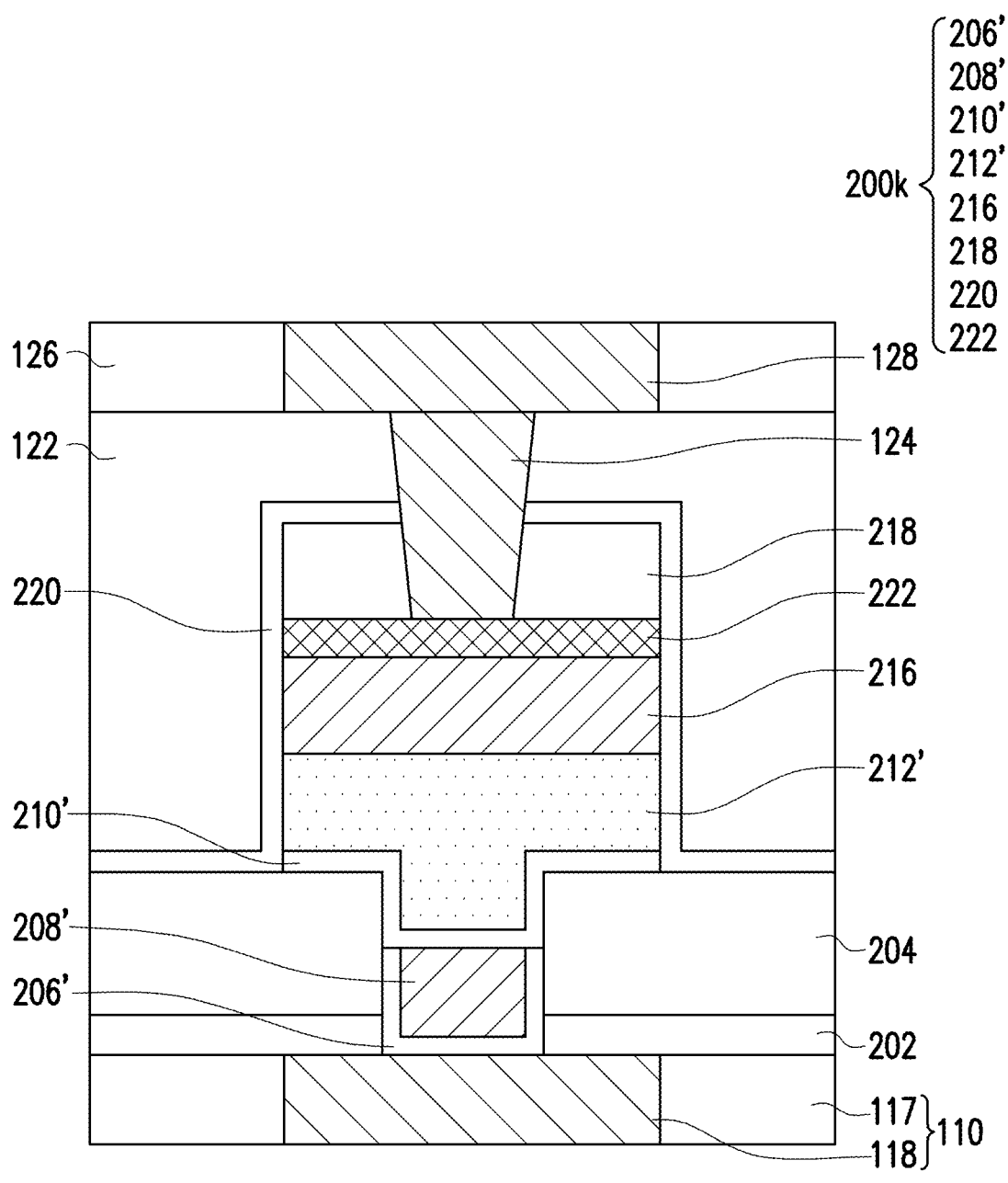
Figure 19:
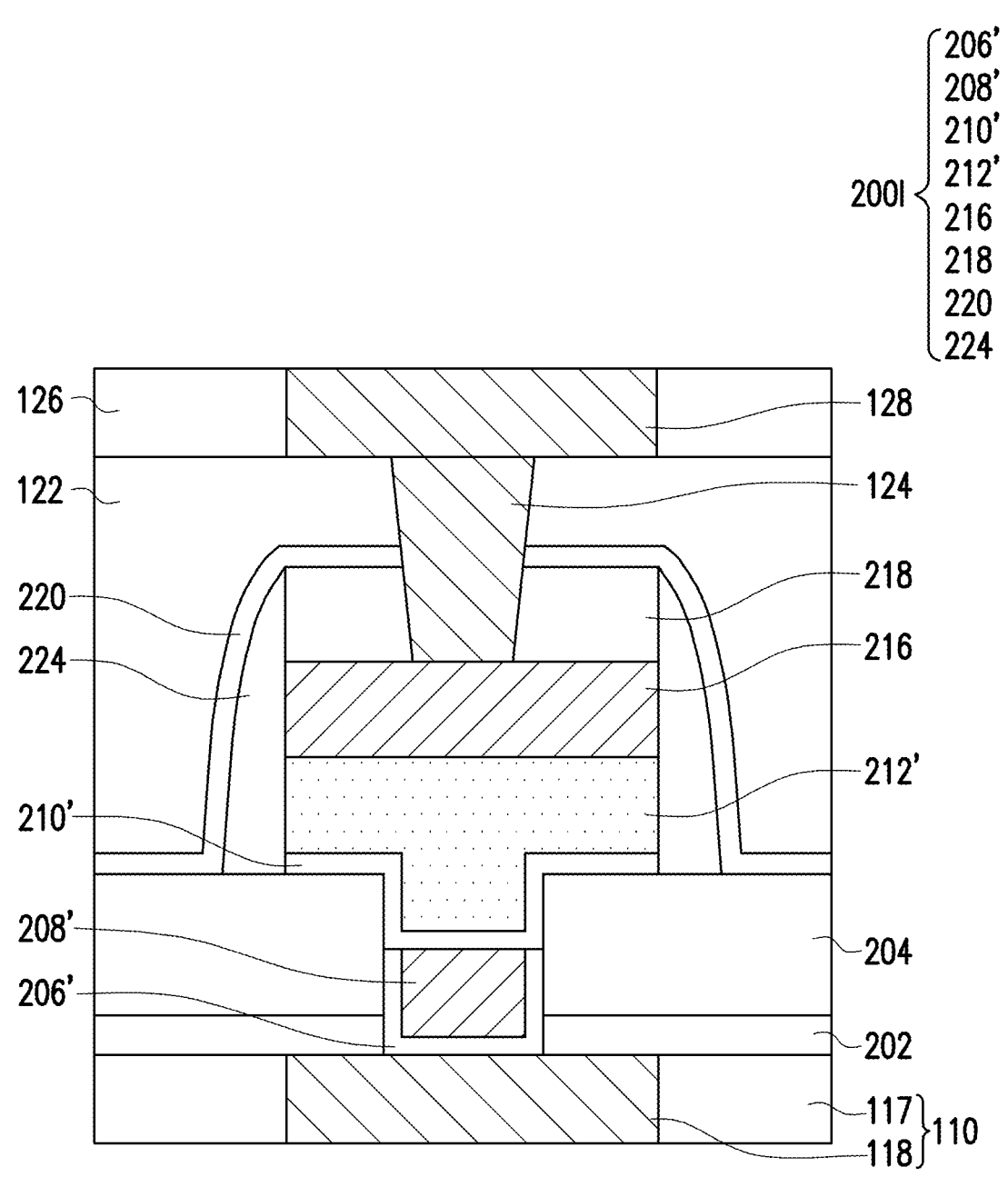
Figure 20:
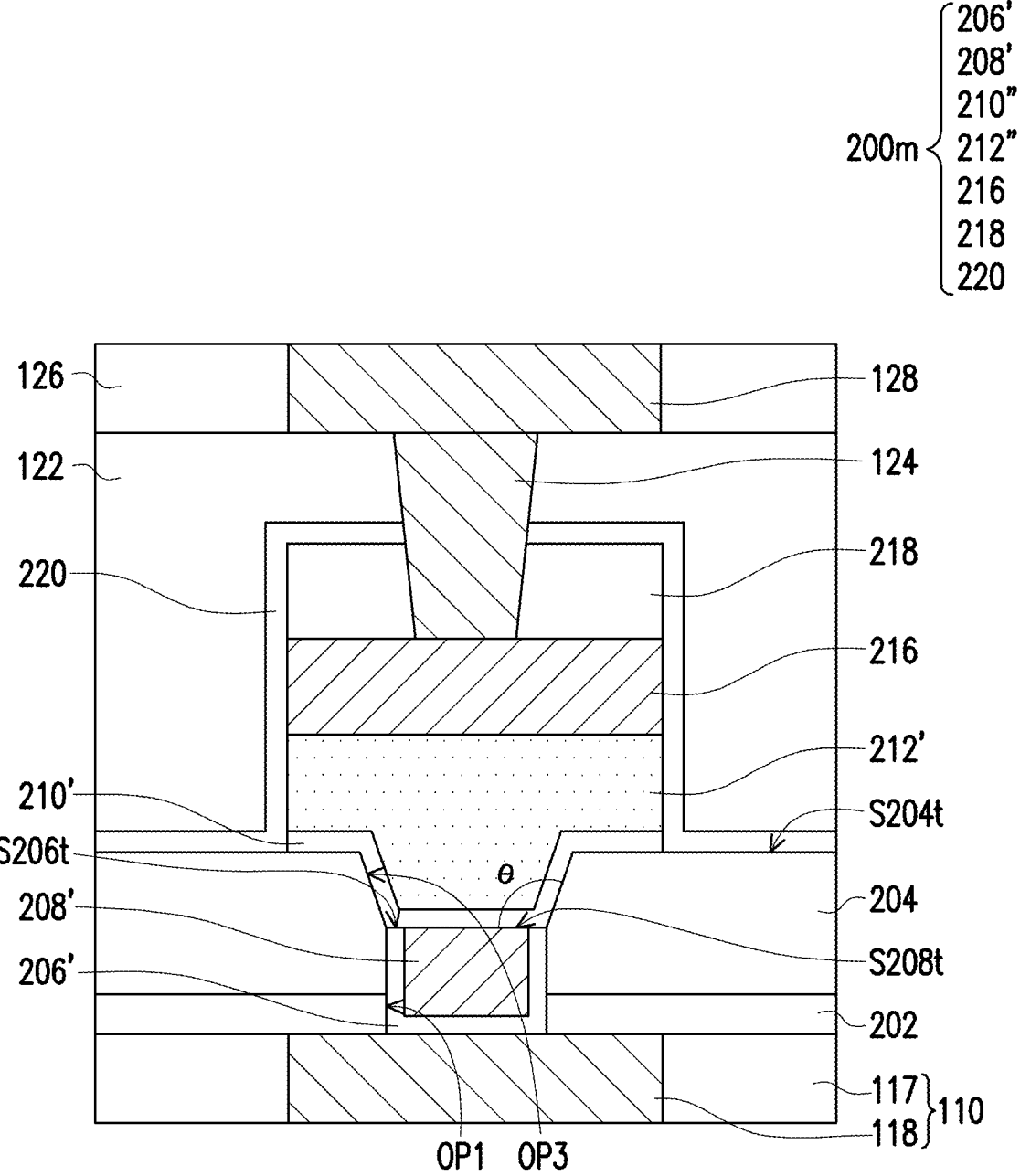

The memory cell 200f may exclude the second buffer layer 214 (e.g., a memory cell 200j depicted in FIG. 17). The memory cell 200g may exclude the second buffer layer 214 (e.g., a memory cell 200k depicted in FIG. 18). The memory cell 200h may exclude the second buffer layer 214 (e.g., a memory cell 200l depicted in FIG. 19). The disclosure is not limited thereto. In one alternative embodiment, the memory cell 200l may further adopt a selector as discussed in FIG. 8 above.

FIG. 21 through FIG. 24 are schematic cross-sectional views showing a method of manufacturing a memory cell in accordance with some alternative embodiments of the disclosure. The elements similar to or substantially the same as the elements described previously will use the similar or same reference numbers, and certain details or descriptions (e.g., formation methods, materials, and so on) of the same elements may not be repeated herein.

Figure 21:
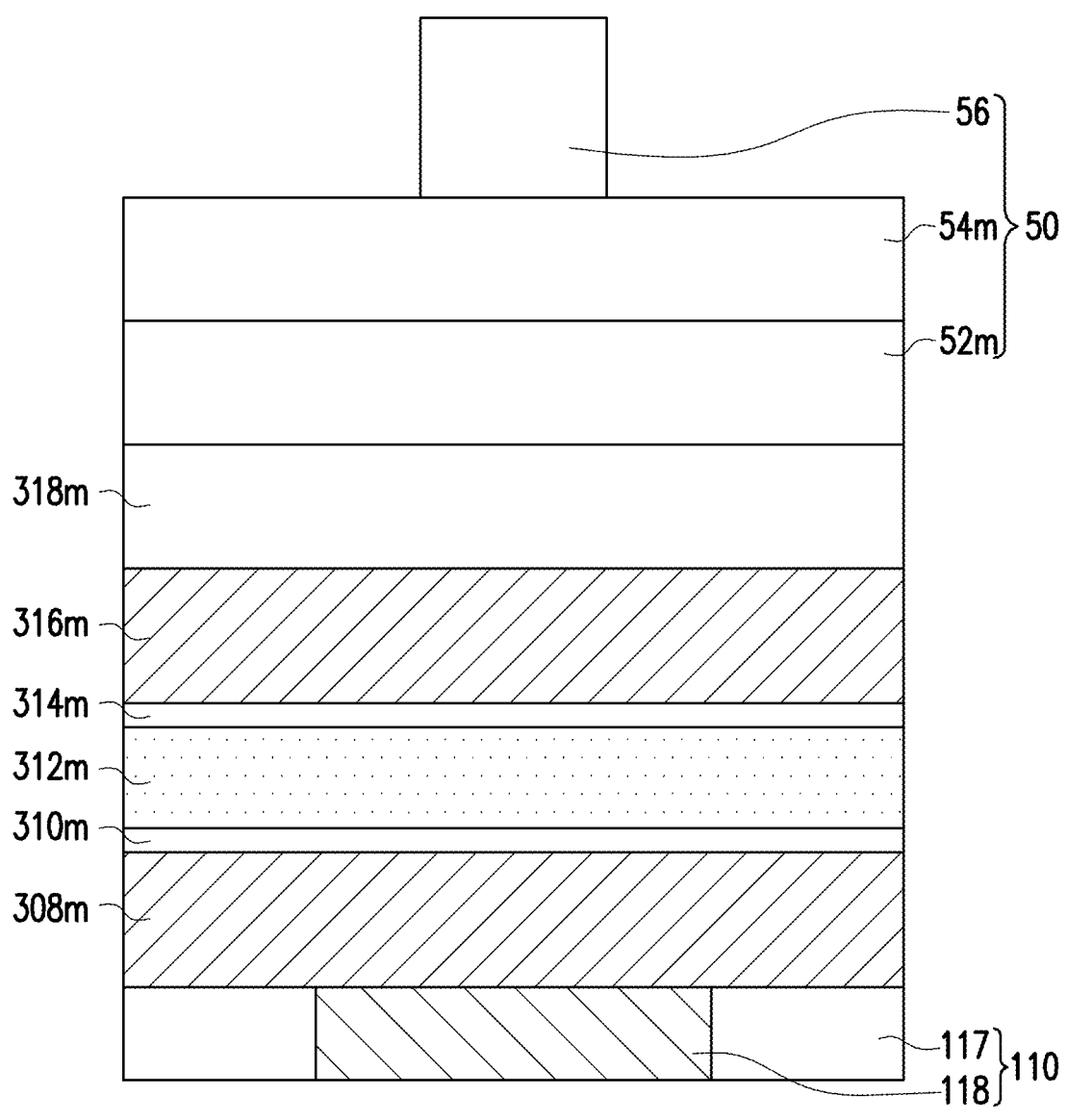
FIG. 21 through FIG. 24 are schematic cross-sectional views showing a method of manufacturing a memory cell in accordance with some alternative embodiments of the disclosure.
Figure 24:
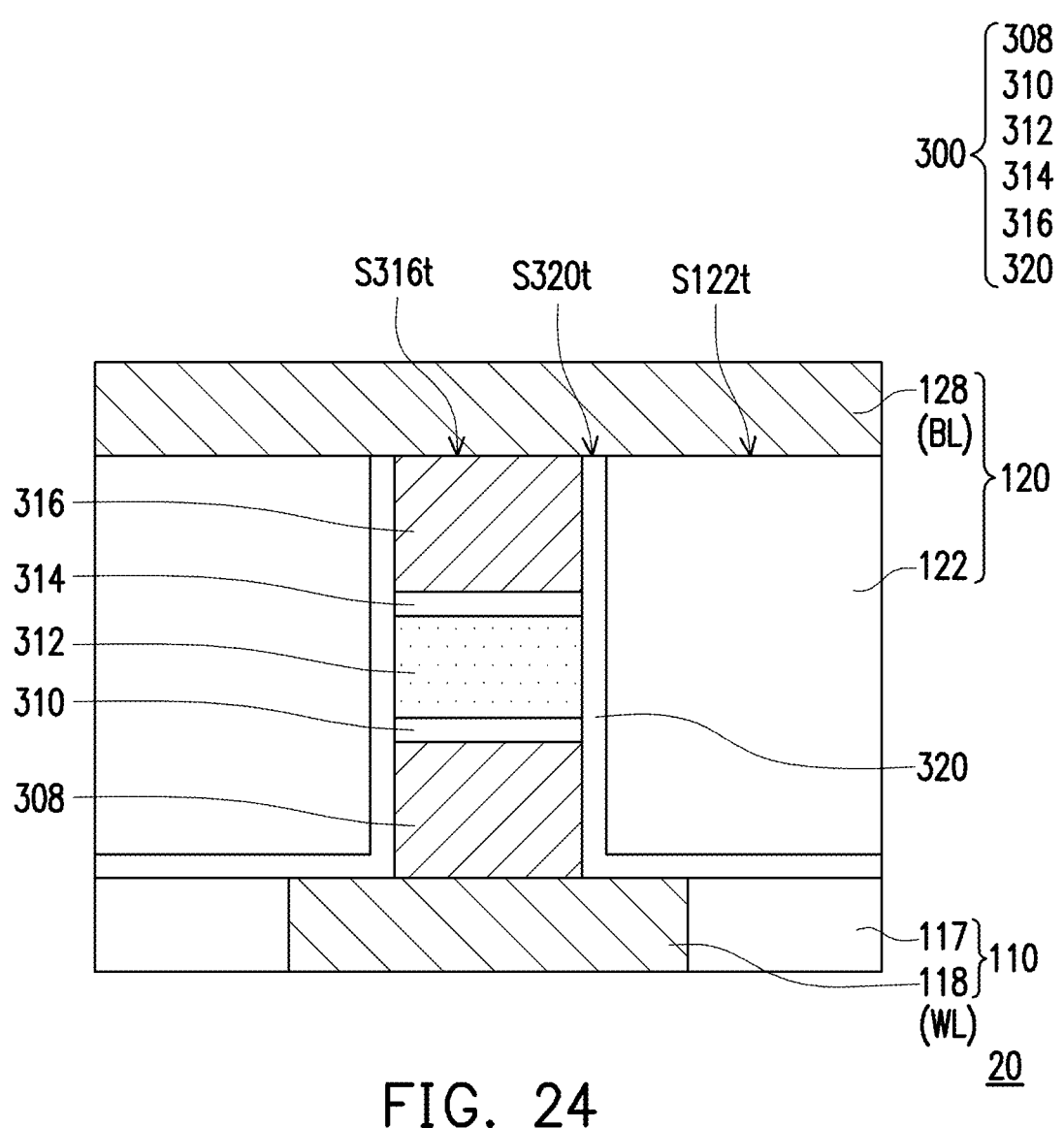

Referring to FIG. 21, in some embodiments, a method of forming a semiconductor device 20 having a memory cell 300 (as shown in FIG. 24) includes following steps. First, an initial structure illustrated in FIG. 21 is provided. The initial structure includes a first interconnect structure 110, a stack structure disposed on the first interconnect structure 110, and a photoresist layer 50 disposed on the stack structure, in some embodiments. For example, the stack structure is interposed between the photoresist layer 50 and the first interconnect structure 110. As shown in FIG. 21, the stack structure may include, from bottom to top, a bottom electrode material layer 308m, a first buffer material layer 310m, a storage element material layer 312m, a second buffer material layer 314m, a top electrode material layer 316m, and a first hard mask material layer 318m. The details of the first interconnect structure 110 have been described in FIG. 1, the details of the photoresist layer 50 have been described in FIG. 2, and thus are not repeated herein for brevity. The photoresist layer 50 may correspond to a conductive layer 118 of the first interconnect structure 110. That is, a photoresist pattern 56 of the photoresist layer 50 is disposed directly on the conductive layer 118, for example, as shown in FIG. 21.

The formation and materials of the bottom electrode material layer 308m may be similar to or substantially identical to the formation and materials of the bottom electrode 208 previously described in FIG. 1, the formations and materials of the first buffer material layer 310m, the storage element material layer 312m, the second buffer material layer 314m, the top electrode material layer 316m, and the first hard mask material layer 318m may be similar to or substantially identical to the formations and materials of the first buffer material layer 210m, the storage element material layer 212m, the second buffer material layer 214m, the top electrode material layer 216m, and the first hard mask material layer 218m previously described in FIG. 2, respectively; thus are not repeated herein for simplicity.

Figure 22:
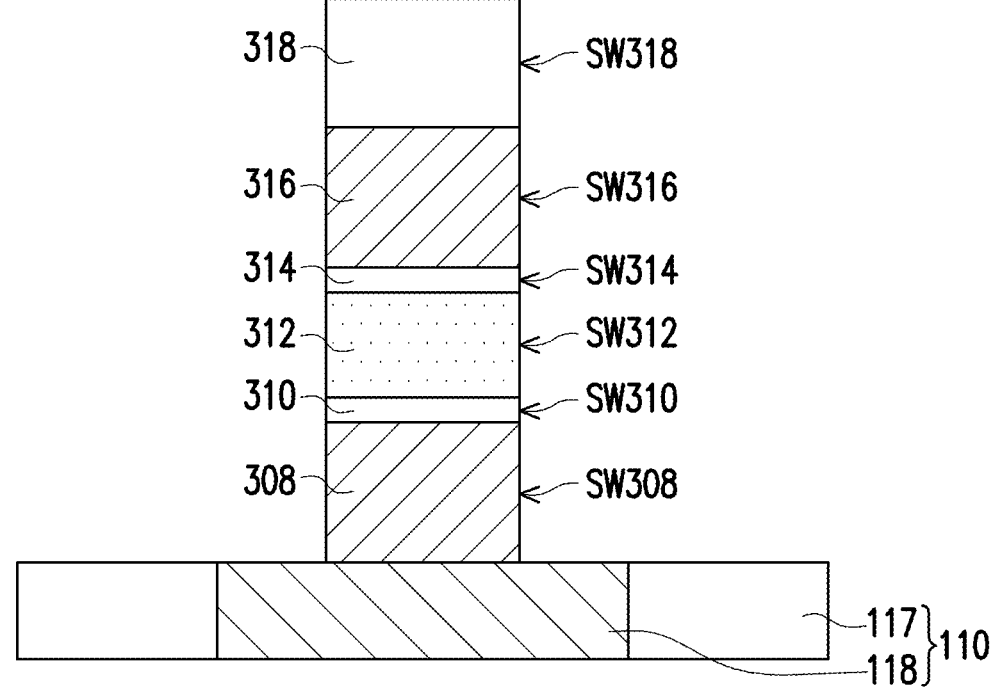

Referring to FIG. 22, in some embodiments, the stack structure is patterned using the photoresist layer 50 as a mask. The patterning may be similar to the patterning processes previously described in FIG. 3 through FIG. 6, and thus is not repeated herein. In the case, a portion of the first hard mask material layer 318m is removed to form a first hard mask layer 318, a portion of the top electrode material layer 316m is removed to form a top electrode 316, a portion of the second buffer material layer 314m is removed to form a second buffer layer 314, a portion of the storage element material layer 312m is removed to form a storage element layer 312, a portion of the first buffer material layer 310m is removed to form a first buffer layer 310, and a portion of the bottom electrode material layer 308m is removed to form a bottom electrode 308. A portion of the first interconnect structure 110 is exposed by the bottom electrode 308, the first buffer layer 310, the storage element layer 312, the second buffer layer 314, the top electrode 316, and the first hard mask layer 318. As illustrate in FIG. 22, for example, sidewalls SW308 of the bottom electrode 308, sidewalls SW310 of the first buffer layer 310, sidewalls SW312 of the storage element layer 312, sidewalls SW314 of the second buffer layer 314, sidewalls SW316 of the top electrode 316, and sidewalls SW318 of the first hard mask layer 318 are substantially aligned with one another within the process variations.

The bottom electrode 308 is disposed on (e.g., in contact with) the conductive layer 118 of the first interconnect structure 110, in some embodiments. As shown in FIG. 22, the bottom electrode 308 may be electrically coupled to the conductive layer 118 of the first interconnect structure 110 by direct contact. Alternatively, a barrier layer (not shown) may be formed between the bottom electrode 308 and the conductive layer 118, where the details of the barrier layer may be similar to or substantially identical to the details of the barrier layer 206 previously described in FIG. 1; thus, are not repeated herein.

Figure 23:
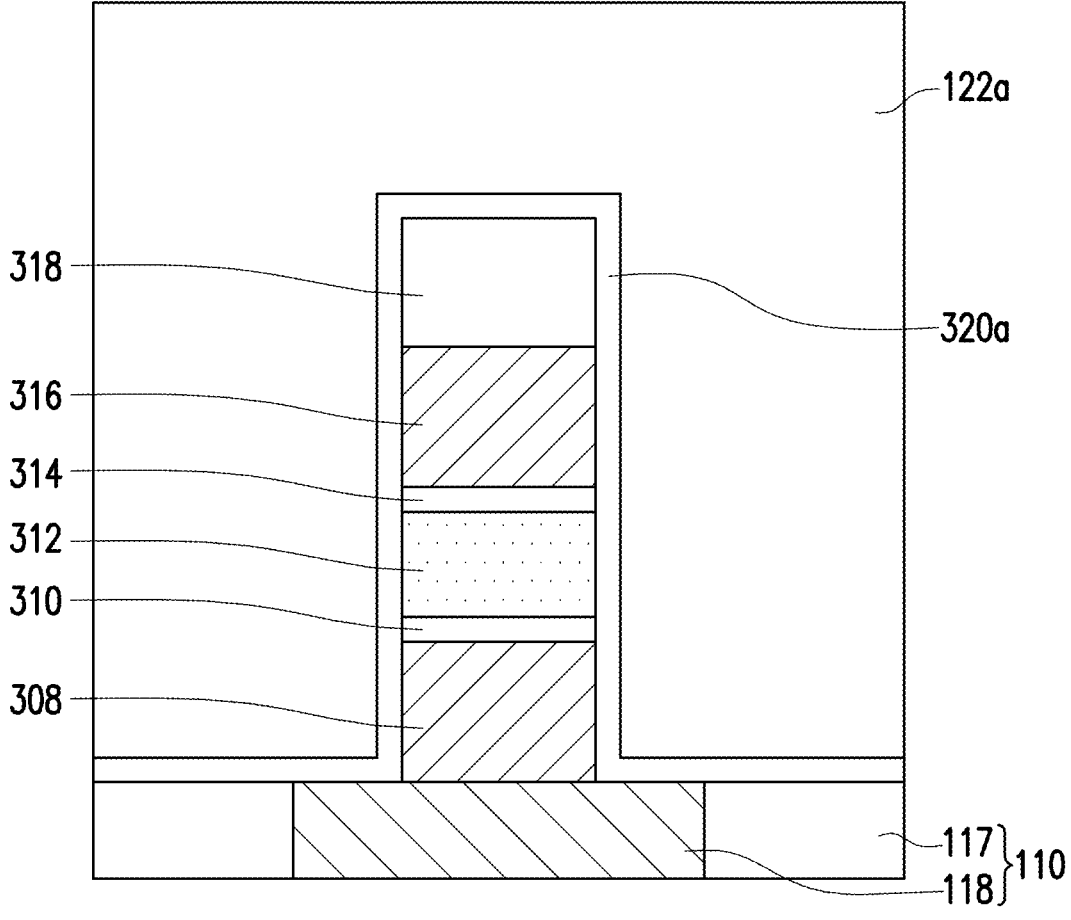

Referring to FIG. 23, in some embodiments, a protection material layer 320a and an insulating material layer 122a are sequentially formed on the structure of FIG. 22. The protection material layer 320a covers the structure of FIG. 22, and is further embedded in the insulating material layer 122*a*, in some embodiments. The formation and materials of the protection material layer 320*a* are substantially identical to the formation and materials of the protection layer 220, the formation and materials of the insulating material layer 122*a* are substantially identical to the formation and materials of the insulating material layer 122, and thus are omitted for brevity.

Referring to FIG. 24, in some embodiments, a planarizing process is formed on the insulating material layer 122*a* and the protection material layer 320*a* to form an insulating layer 122 and a protection layer 320 exposing the top electrode 316. During the planarizing process, the first hard mask layer 318 is removed, for example. The top electrode 316 may be accessibly revealed by the insulating layer 122 and the protection layer 320, as shown in FIG. 24. In some embodiments, the planarizing process includes a grinding process, a CMP process, an etching process, or combinations thereof. As shown in FIG. 24, a top surface S320*t* of the protection layer 320 and a top surface S316*t* of the top electrode 316 may be substantially coplanar with the top surface S122*t* of the insulating layer 122 within the process variations. After the planarizing process, in some embodiments, a conductive layer 128 is formed over the top electrode 316, the protection layer 320, and the insulating layer 122. As shown in FIG. 24, the conductive layer 128 may electrically couple to the top electrode 316 by direct contact. The formation and materials of the conductive layer 128 have been described in FIG. 7, and thus are omitted for simplicity. The insulating layer 122, a conductive via (not shown) formed in the insulating layer 122, an additional insulating layer (not shown) stacked on the insulating layer 122, and the conductive layer 128 laterally covered by the additional insulating layer may together constitute a second interconnect structure 120.

As shown in FIG. 24, the semiconductor device 20 with the memory cell 300 is accomplished after forming the conductive layer 128. Specifically, the memory cell 300 may include the bottom electrode 308, the top electrode 316, the storage element layer 312 between the bottom and top electrodes 308 and 316, the first buffer layer 310 between the bottom electrode 308 and the storage element layer 312, the second buffer layer 314 between the storage element layer 312 and the top electrode 316, and the protection layer 320 covering the sidewalls of the top electrode 316 and its underlying layers. Owing to the first buffer layer 310, the memory cell 300 is able to be operated with a lowering input current applied onto the bottom electrode 308 as similar to the operation of the memory cell 200 as discussed above.

In some embodiments, the memory cell 300 is in form of a pillar or column extending along a stacking direction of the first interconnect structure 110 and the second interconnect structure 120. Due to the memory cell 300 is in an elongated pillar or column form, the memory cell 300 can be electrically coupled to the second interconnect structure 120 by connecting the conductive layer 128, where there is no conductive via between the memory cell 300 and the conductive layer 128. In some embodiments, the conductive layer 118 electrically coupled to the bottom electrode 308 is referred as a word line WL, and the conductive layer 128 electrically coupled to the top electrode 316 is referred as a bit line BL, or vice versa; the disclosure is not limited thereto. In alternative embodiments, the conductive layer 118 electrically coupled to the bottom electrode 308 is referred as a word line WL, and the conductive layer 128 electrically coupled to the top electrode 316 is referred as a source line (not shown), or vice versa. In that case, the memory cell 300 is referred to as a PCM cell of threedimensional cross-point (3DXP). In a plane orthogonal to the stacking direction of the first interconnect structure 110 and the second interconnect structure 120, the word line WL connected to the top electrode 316 is extended along a first direction, while the bit line BL (or the source line) connected to the bottom electrode 308 is extended along a second direction, in some embodiments. For example, the first direction is perpendicular to the second direction.

Although only one memory cell 300 is shown in the semiconductor device 20 of FIG. 24 for illustrative purpose, the disclosure is not limited thereto. The number of the memory cell may be one or more than one depending on the design requirement and demand. FIG. 25 through FIG. 29 are respectively schematic sectional views of a memory cell in accordance with some other alternative embodiments of the disclosure. In some embodiments, the memory cell 300 included in the semiconductor device 20 may be substituted by any one of memory cells 300*a*-300*e* respectively depicted in FIG. 25 to FIG. 29.

Figure 25:
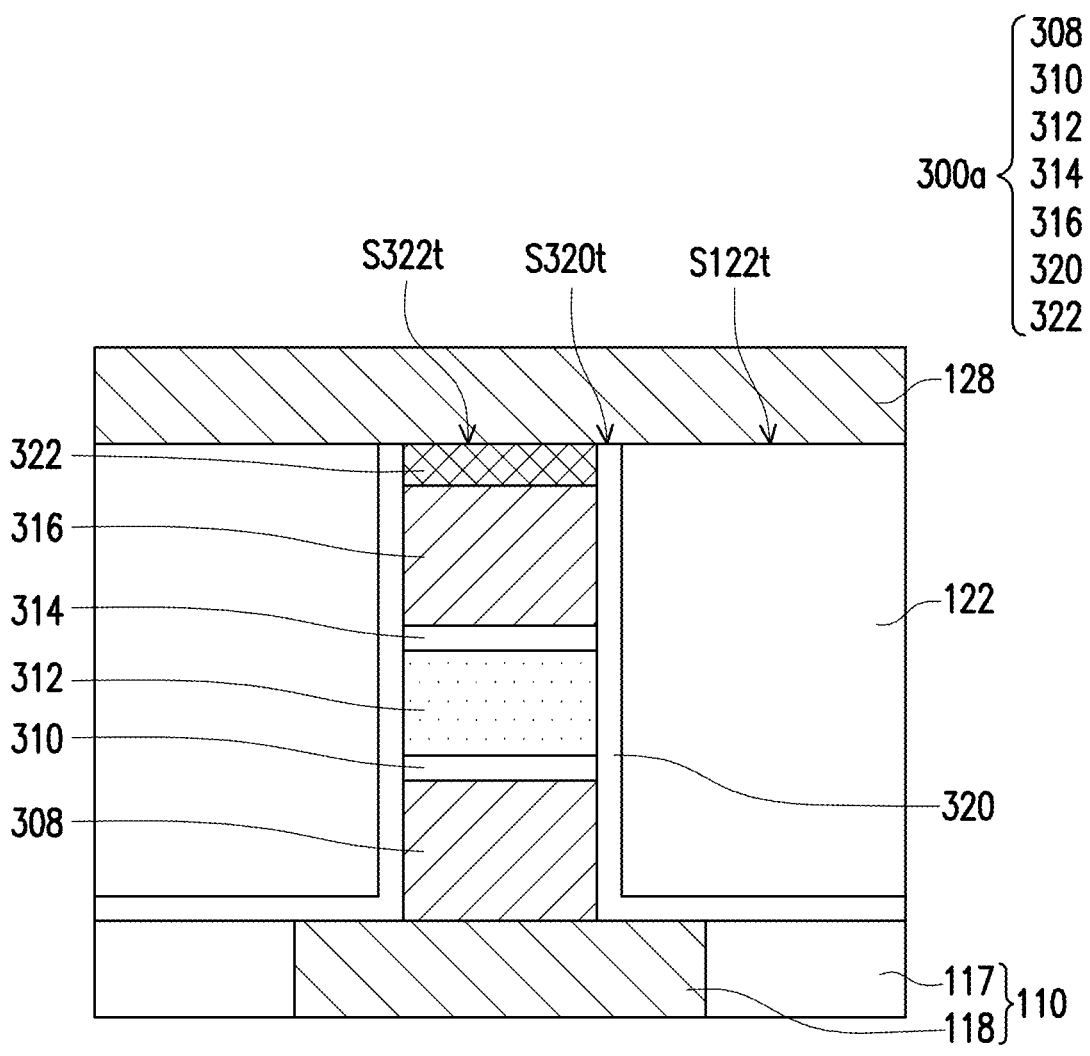
FIG. 25 through FIG. 29 are respectively schematic sectional views of a memory cell in accordance with some other alternative embodiments of the disclosure.

Referring to FIG. 25, in some embodiments, the memory cell 300*a* is similar to the memory element 300 of FIG. 24; that is, the structures, materials, and functions of the memory element 300*a* are similar to those of the memory element 300, and thus the details are omitted herein. The main difference between the memory element 300*a* and the memory element 300 lies in that the memory cell 300*a* further includes a selector 322 disposed on the top electrode 316. As shown in FIG. 25, a top surface S322*t* of the selector 322 may be substantially coplanar with the top surface S320*t* of the protection layer 320 and the top surface S122*t* of the insulating layer 122 within the process variations. For example, the conductive layer 128 is disposed on (e.g., in contact with) the selector 322, the selector 322 is interposed between the top electrode 316 and the conductive layer 128. As shown in FIG. 25, the sidewalls of the bottom electrode 308, the first buffer layer 310, the storage element layer 312, the second buffer layer 314, the top electrode 316, and the selector 322 may be substantially aligned with one another within the process variations. For example, the sidewalls of the bottom electrode 308, the first buffer layer 310, the storage element layer 312, the second buffer layer 314, top electrode 316, and the selector 322 are covered by the protection layer 320. The details (e.g., the formation, material, thickness, configuration or the like) of the selector 322 may be similar to or substantially identical to the details (e.g., the formation, material, thickness, configuration or the like) of the selector 222 previously described in FIG. 8, and thus are not repeated herein.

Figure 26:
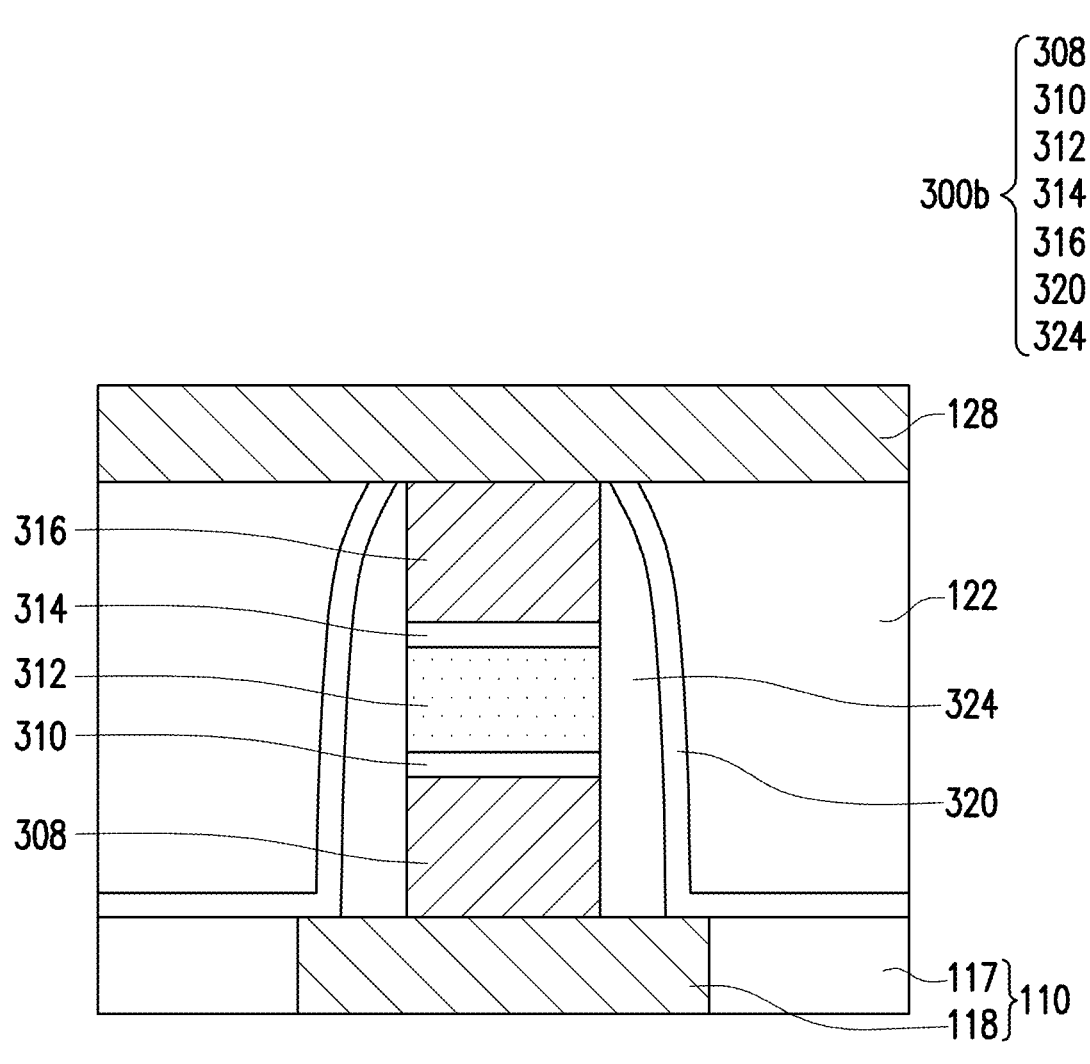

Referring to FIG. 26, in some embodiments, the memory cell 300*b* is similar to the memory element 300 of FIG. 24; that is, the structures, materials, and functions of the memory element 300*b* are similar to those of the memory element 300, and thus the details are omitted herein. The main difference between the memory element 300*b* and the memory element 300 lies in that the memory cell 300*b* further includes dielectric spacers 324 at sidewalls of the bottom electrode 308, the first buffer layer 310, the storage element layer 312, the second buffer layer 314, and the top electrode 316. The details (e.g., the formation, material, thickness, configuration or the like) of the dielectric spacers 324 may be similar to or substantially identical to the details (e.g., the formation, material, thickness, configuration or the like) of the dielectric spacers 224 previously described in FIG. 9, and thus are not repeated herein. Alternatively, the memory cell 300*b* may further adopt a selector as discussed in FIG. 8 above.

Figure 27:
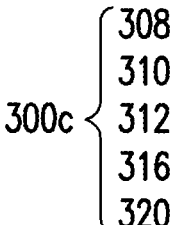
Figure 27:
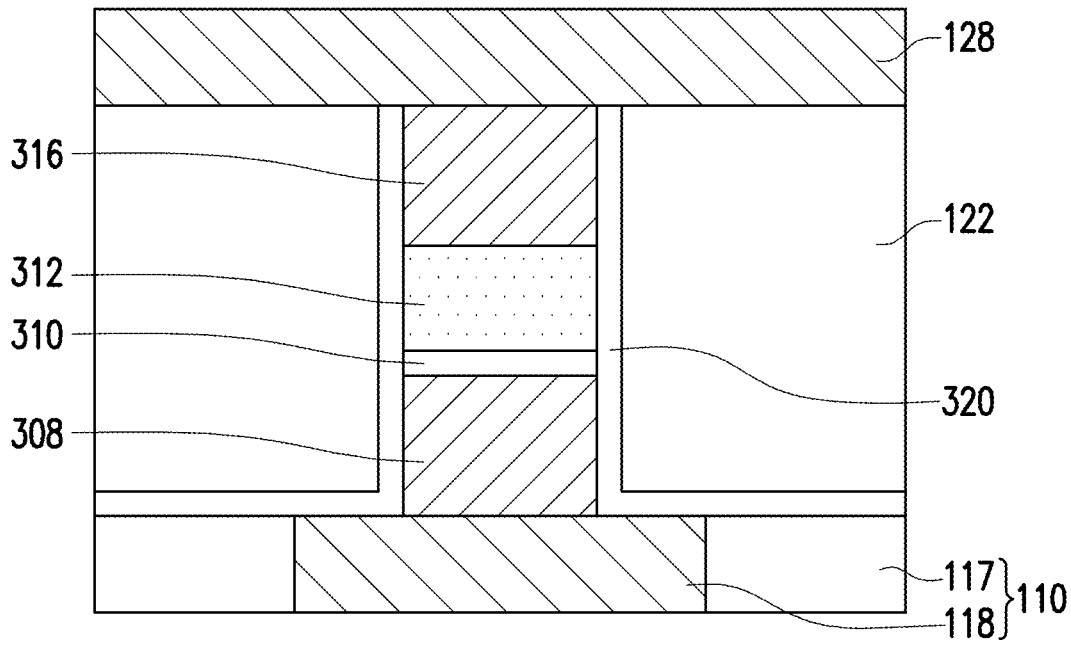
Figure 28:
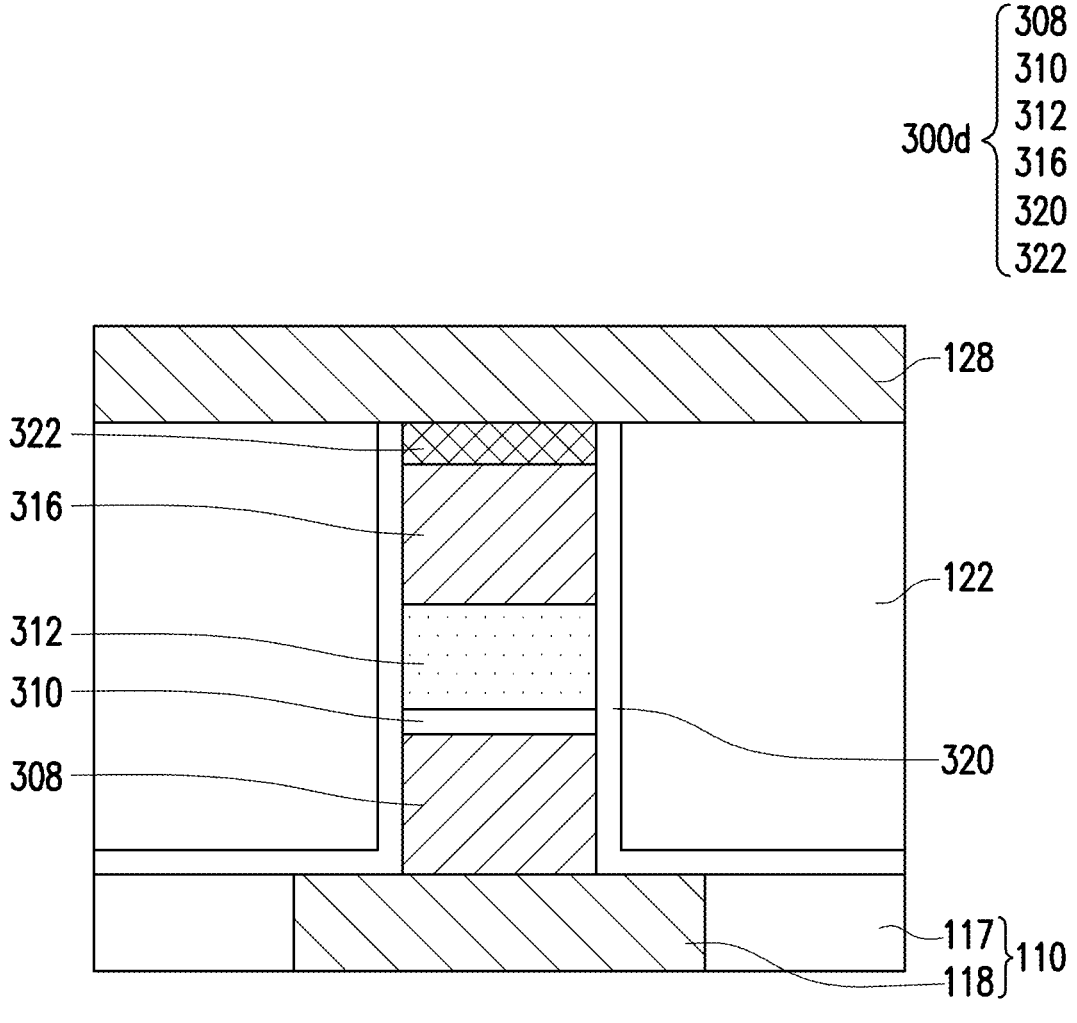
Figure 29:
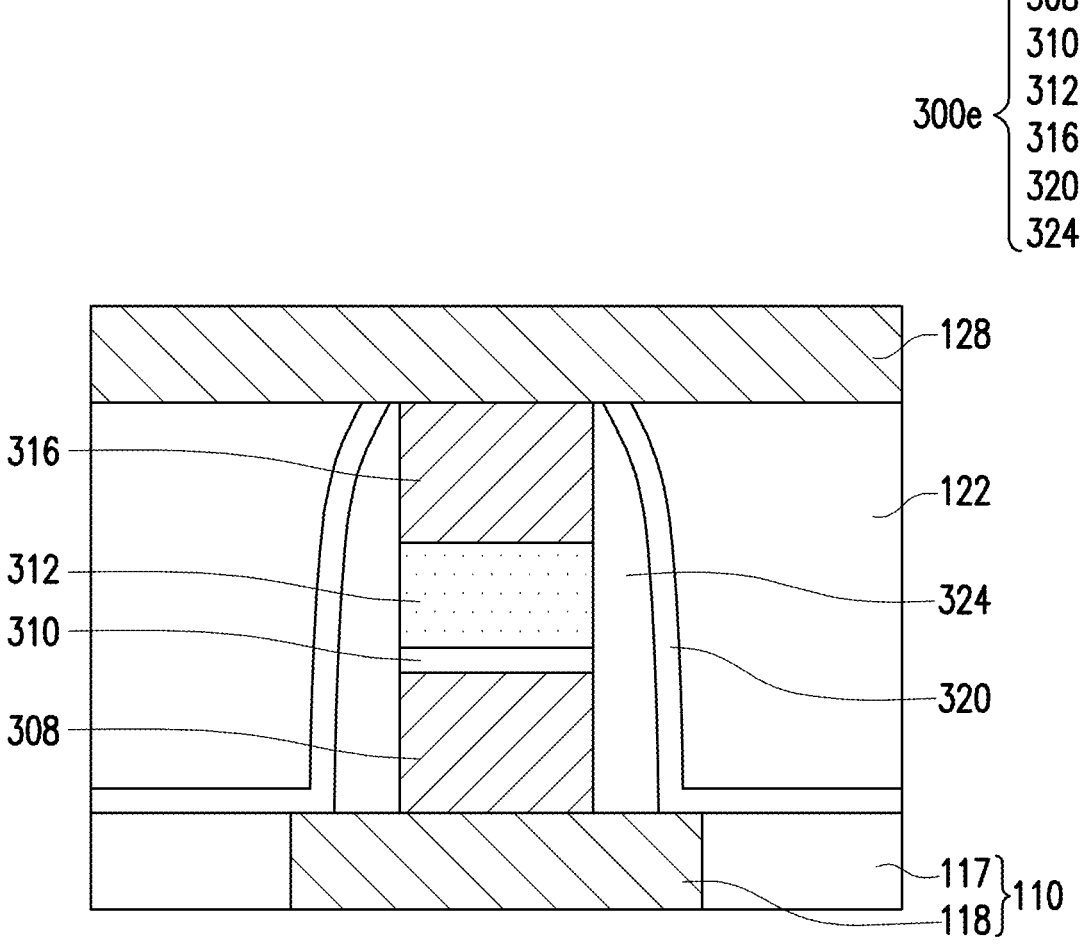

The memory cell 300 may exclude the second buffer layer 314 (e.g., a memory cell 300c depicted in FIG. 27). The memory cell 300a may exclude the second buffer layer 314 (e.g., a memory cell 300d depicted in FIG. 28). The memory cell 300b may exclude the second buffer layer 314 (e.g., a memory cell 300e depicted in FIG. 29). The disclosure is not limited thereto. In one alternative embodiment, the memory cell 300e may further adopt a selector as discussed in FIG. 8 above.

Figure 30:
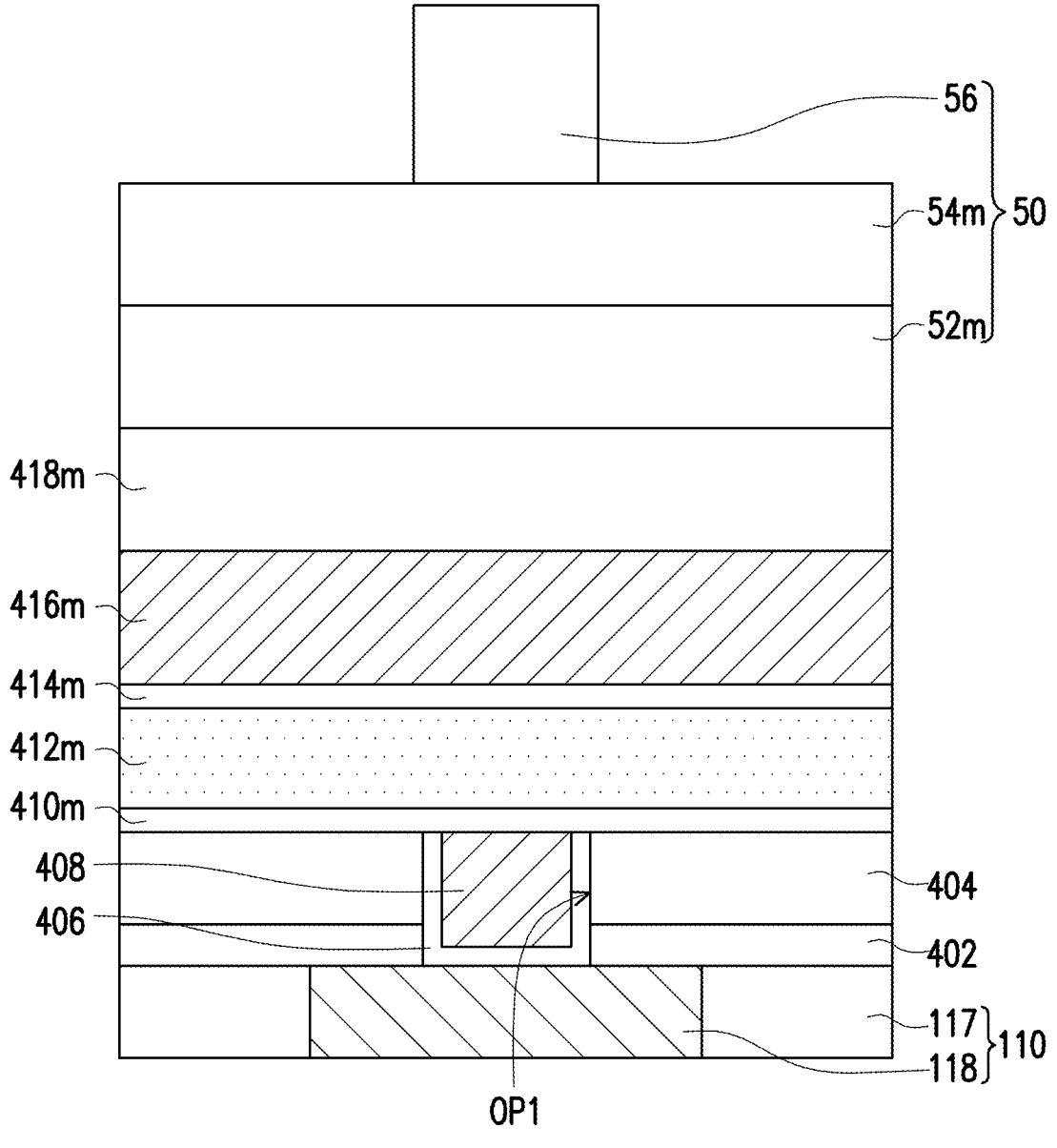
FIG. 30 through FIG. 32 are schematic cross-sectional views showing a method of manufacturing a memory cell in accordance with some alternative embodiments of the disclosure.
Figure 31:
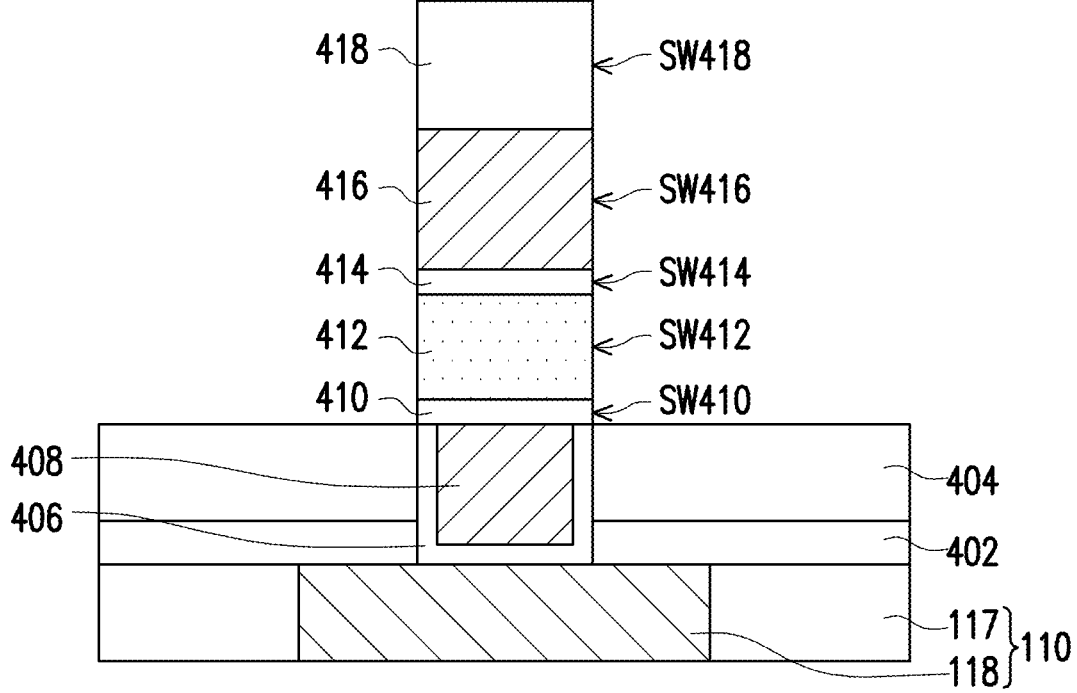
Figure 32:
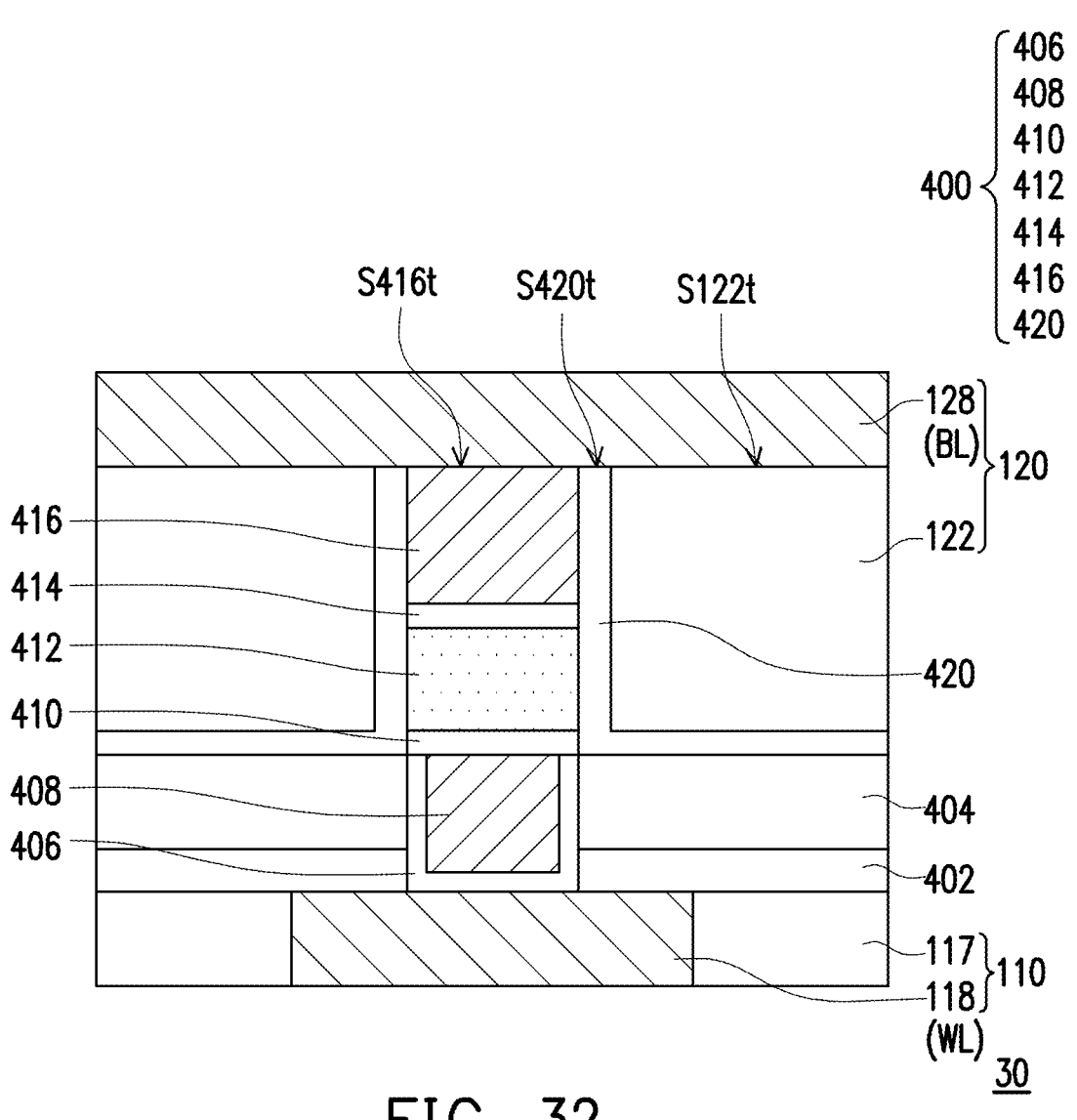

FIG. 30 through FIG. 32 are schematic cross-sectional views showing a method of manufacturing a memory cell in accordance with some alternative embodiments of the disclosure. The elements similar to or substantially the same as the elements described previously will use the similar or same reference numbers, and certain details or descriptions (e.g., formation methods, materials, and so on) of the same elements may not be repeated herein.

Referring to FIG. 30, in some embodiments, a method of forming a semiconductor device 30 having a memory cell 400 (as shown in FIG. 32) includes following steps. First, an initial structure illustrated in FIG. 30 is provided. The initial structure includes a first interconnect structure 110, a first dielectric layer 402, a second dielectric layer 404, a barrier layer 406, and a bottom electrode 408, a stack structure disposed on the second dielectric layer 404, and a photoresist layer 50 disposed on the stack structure, in some embodiments. The details of the first interconnect structure 110 have been previously described in FIG. 1, the details of the photoresist layer 50 have been previously described in FIG. 2, and thus are not repeated herein for brevity.

As illustrated in FIG. 30, the first dielectric layer 402 and the second dielectric layer 404 may be located between the first interconnect structure 110 and the stack structure. For example, the first dielectric layer 402 is interposed between the second dielectric layer 404 and the first interconnect structure 110, and the second dielectric layer 404 is interposed between the stack structure and the first dielectric layer 402. An opening OP1 may be formed in the first dielectric layer 402 and the second dielectric layer 404, as shown in FIG. 30. For example, the bottom electrode 408 is located inside the opening OP1 penetrating through the first and second dielectric layer 402 and 404, and the barrier layer 406 is surround the sidewalls and bottom surface of the bottom electrode 408. In some embodiments, the bottom electrode 408 is electrically coupled to a conductive layer 118 of the first interconnect structure 110. The formations and materials of the first dielectric layer 402, the second dielectric layer 404, the barrier layer 406, and the bottom electrode 408 may be similar to or substantially identical to the formations and materials of the first dielectric layer 202, a second dielectric layer 204, the barrier layer 206, and the bottom electrode 208 previously described in FIG. 1, respectively; thus, are not repeated herein for simplicity.

For example, the stack structure is interposed between the photoresist layer 50 and the second dielectric layer 404. As shown in FIG. 30, the stack structure may include, from bottom to top, a first buffer material layer 410m, a storage element material layer 412m, a second buffer material layer 414m, a top electrode material layer 416m, and a first hard mask material layer 418m. The details of the first buffer material layer 410m, the storage element material layer 412m, the second buffer material layer 414m, the top electrode material layer 416m, and the first hard mask material layer 418m may be similar to or substantially identical to the details of the first buffer material layer 210m, the storage element material layer 212m, the second buffer material layer 214m, the top electrode material layer 216m, and the first hard mask material layer 218m previously described in FIG. 2, and thus are not repeated herein for brevity. The photoresist layer 50 may correspond to the bottom electrode 408. That is, a photoresist pattern 56 of the photoresist layer 50 is disposed directly on the bottom electrode 408, for example.

Referring to FIG. 31, in some embodiments, the stack structure is patterned using the photoresist layer 50 as a mask. The patterning may be similar to the patterning processes previously described in FIG. 3 through FIG. 6, and thus is not repeated herein. In the case, a portion of the first hard mask material layer 418m is removed to form a first hard mask layer 418, a portion of the top electrode material layer 416m is removed to form a top electrode 416, a portion of the second buffer material layer 414m is removed to form a second buffer layer 414, a portion of the storage element material layer 412m is removed to form a storage element layer 412, and a portion of the first buffer material layer 410m is removed to form a first buffer layer 410. A portion of the second dielectric layer 404 is exposed by the first buffer layer 410, the storage element layer 412, the second buffer layer 414, the top electrode 416, and the first hard mask layer 418. As illustrate in FIG. 31, for example, sidewalls SW410 of the first buffer layer 410, sidewalls SW412 of the storage element layer 412, sidewalls SW414 of the second buffer layer 414, sidewalls SW416 of the top electrode 416, and sidewalls SW418 of the first hard mask layer 418 are substantially aligned with one another within the process variations. The first buffer layer 410 is disposed on (e.g., in contact with) the bottom electrode 408, in some embodiments. As shown in FIG. 31, the first hard mask layer 418, the top electrode 416, the second buffer layer 414, the storage element layer 412 and the first buffer layer 410 may overlapped with the bottom electrode 408 in projection on the first interconnect structure 110 along a stacking direction of the stack structure.

Referring to FIG. 32, in some embodiments, the processes of FIG. 23 through FIG. 24 are performed on the structure of FIG. 31 to form a protection layer 420 and an insulating layer 122 exposing the top electrode 416 and a conductive layer 128 disposed on the top electrode 416 exposed therefrom. The first hard mask layer 418 is removed, for example. The conductive layer 128 is electrically coupled to the top electrode 416, in some embodiments. The formations and the materials of the protection layer 420, the insulating layer 122, and the conductive layer 128 may be similar to or substantially identical to the formations and the materials of the protection layer 320, the insulating layer 122, and the conductive layer 128 previously described in FIG. 23 and FIG. 24, and thus are not repeated herein. The insulating layer 122, a conductive via (not shown) formed in the insulating layer 122, an additional insulating layer (not shown) stacked on the insulating layer 122, and the conductive layer 128 laterally covered by the additional insulating layer may constitute a second interconnect structure 120.

As shown in FIG. 32, the semiconductor device 30 with the memory cell 400 is accomplished after forming the conductive layer 128. Specifically, the memory cell 400 may include the bottom electrode 408, the top electrode 416, the storage element layer 412 between the bottom and top electrodes 408 and 416, the first buffer layer 410 between the bottom electrode 408 and the storage element layer 412, the second buffer layer 414 between the storage element layer 412 and the top electrode 416, and the protection layer 420 covering the sidewalls of the top electrode 416 and its underlying layers. The memory cell 400 may further include the barrier layer 406 covering the sidewalls and the bottom surface of the bottom electrode 408, where the first buffer layer 410 may further cover the barrier layer 406. The barrier layer 406 is sandwiched between the bottom electrode 408 and the conductive layer 118, for example. Owing to the first buffer layer 410, the memory cell 400 is able to be operated with a lowering input current applied onto the bottom electrode 408 as similar to the operation of the memory cell 200 as discussed above.

In some embodiments, the memory cell 400 is in form of a pillar or column extending along a stacking direction of the first interconnect structure 110 and the second interconnect structure 120. Due to the memory cell 400 is in an elongated pillar or column form, the memory cell 400 can be electrically coupled to the second interconnect structure 120 by connecting the conductive layer 128, where there is no conductive via between the memory cell 400 and the conductive layer 128. In some embodiments, the conductive layer 118 electrically coupled to the bottom electrode 408 is referred as a word line WL, and the conductive layer 128 electrically coupled to the top electrode 416 is referred as a bit line BL, or vice versa. In alternative embodiments, the conductive layer 118 electrically coupled to the bottom electrode 408 is referred as a word line WL, and the conductive layer 128 electrically coupled to the top electrode 416 is referred as a source line (not shown), or vice versa. In that case, the memory cell 400 is referred to as a PCM cell of 3DXP. The details of the word line WL, the bit line BL and/or the source line have previously described in FIG. 24, and thus are not repeated herein for brevity.

Although only one memory cell 400 is shown in the semiconductor device 30 of FIG. 32 for illustrative purpose, the disclosure is not limited thereto. The number of the memory cell may be one or more than one depending on the design requirement and demand. FIG. 33 through FIG. 37 are respectively schematic sectional views of a memory cell in accordance with some other alternative embodiments of the disclosure. In some embodiments, the memory cell 400 included in the semiconductor device 30 may be substituted by any one of memory cells 400a-400e respectively depicted in FIG. 33 to FIG. 37.

Figure 33:
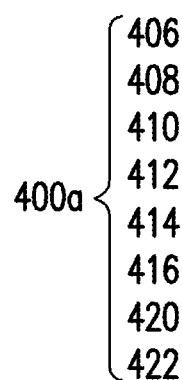
FIG. 33 through FIG. 37 are respectively schematic sectional views of a memory cell in accordance with some other alternative embodiments of the disclosure.
Figure 33:
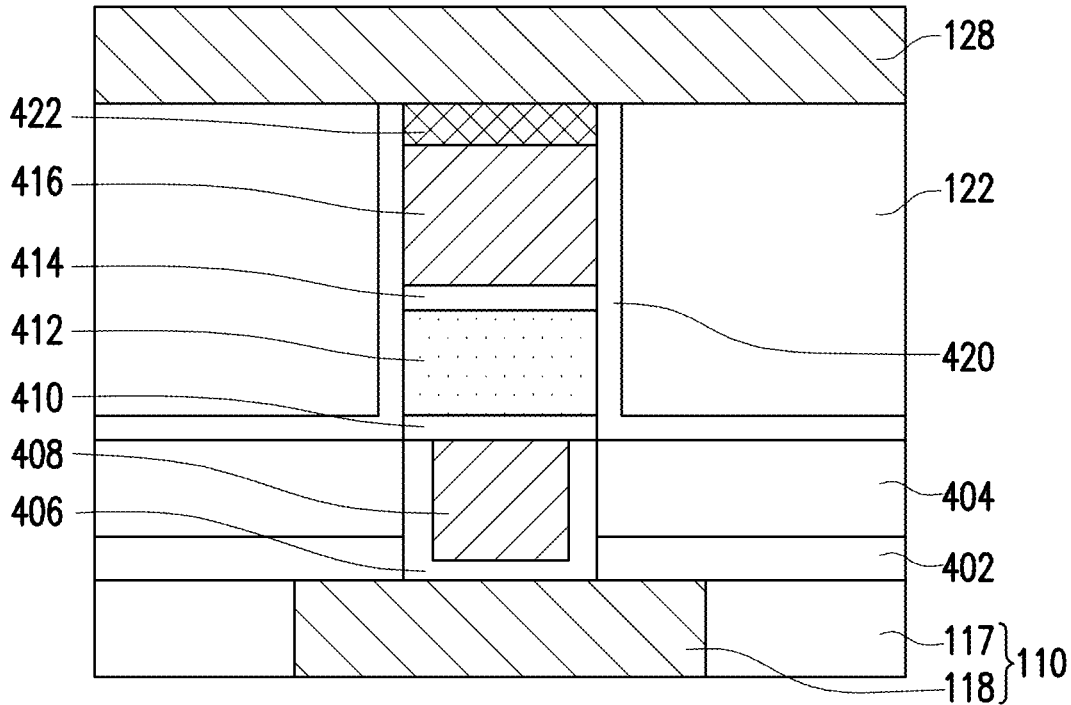

Referring to FIG. 33, in some embodiments, the memory cell 400a is similar to the memory element 400 of FIG. 32; that is, the structures, materials, and functions of the memory element 400a are similar to those of the memory element 400, and thus the details are omitted herein. The main difference between the memory element 400a and the memory element 400 lies in that the memory cell 400a further includes a selector 422 disposed on the top electrode 416. As shown in FIG. 33, a top surface of the selector 422 may be substantially coplanar with the top surface of the protection layer 420 and the top surface of the insulating layer 122 within the process variations. For example, the conductive layer 128 is disposed on (e.g., in contact with) the selector 422, and the selector 422 is interposed between the top electrode 416 and the conductive layer 128. As shown in FIG. 33, the sidewalls of the first buffer layer 410, the storage element layer 412, the second buffer layer 414, the top electrode 416, and the selector 422 may be substantially aligned with one another within the process variations. For example, the sidewalls of the first buffer layer 410, the storage element layer 412, the second buffer layer 414, the top electrode 416, and the selector 422 are covered by the protection layer 420. The details (e.g., the formation, material, thickness, configuration or the like) of the selector 422 may be similar to or substantially identical to the details (e.g., the formation, material, thickness, configuration or the like) of the selector 222 previously described in FIG. 8, and thus are not repeated herein.

Figure 34:
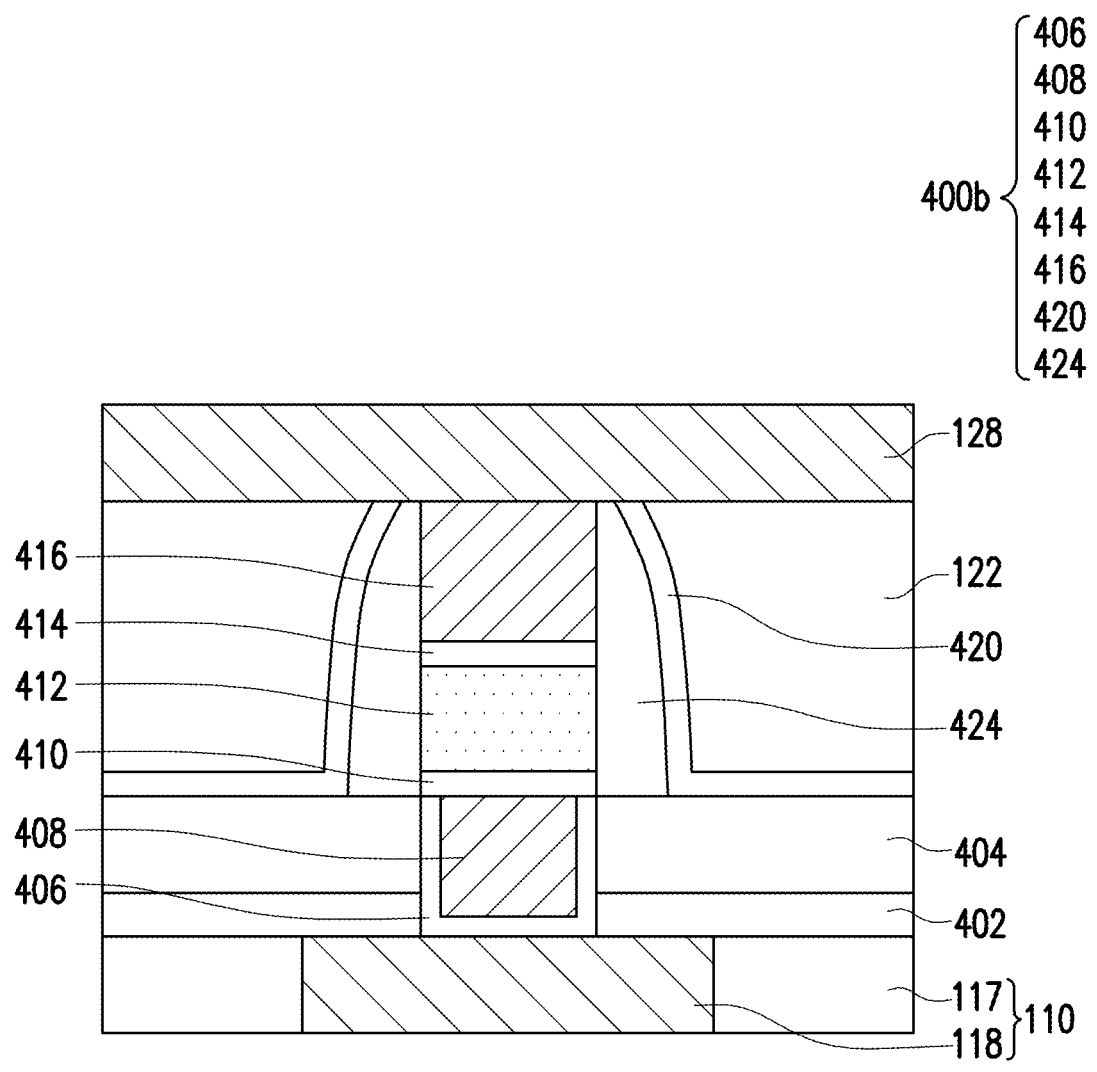
Figure 35:
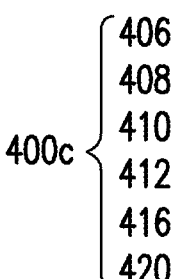
Figure 35:
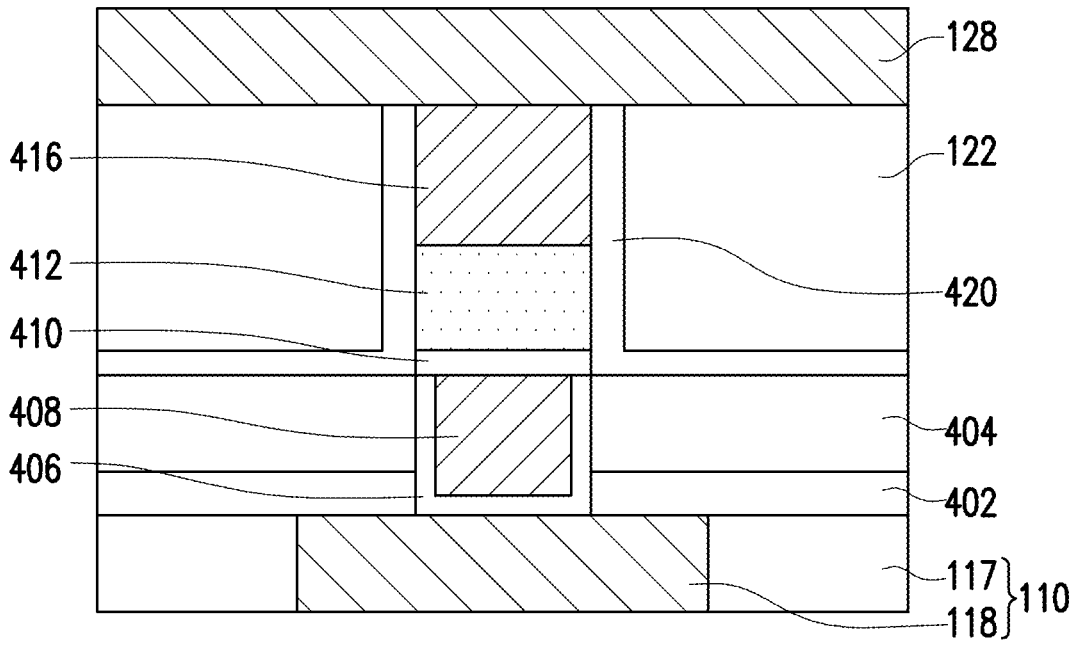
Figure 36:
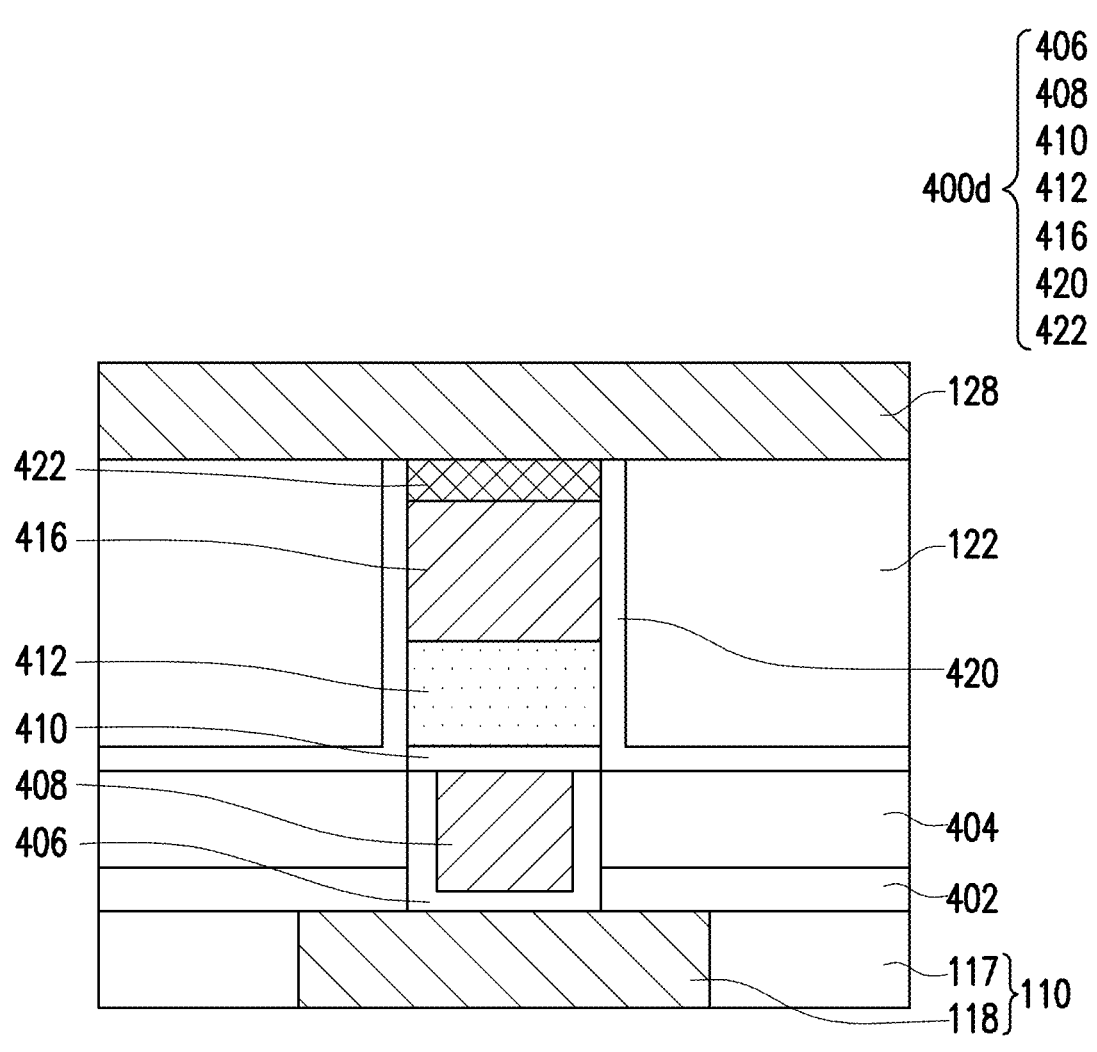
Figure 37:
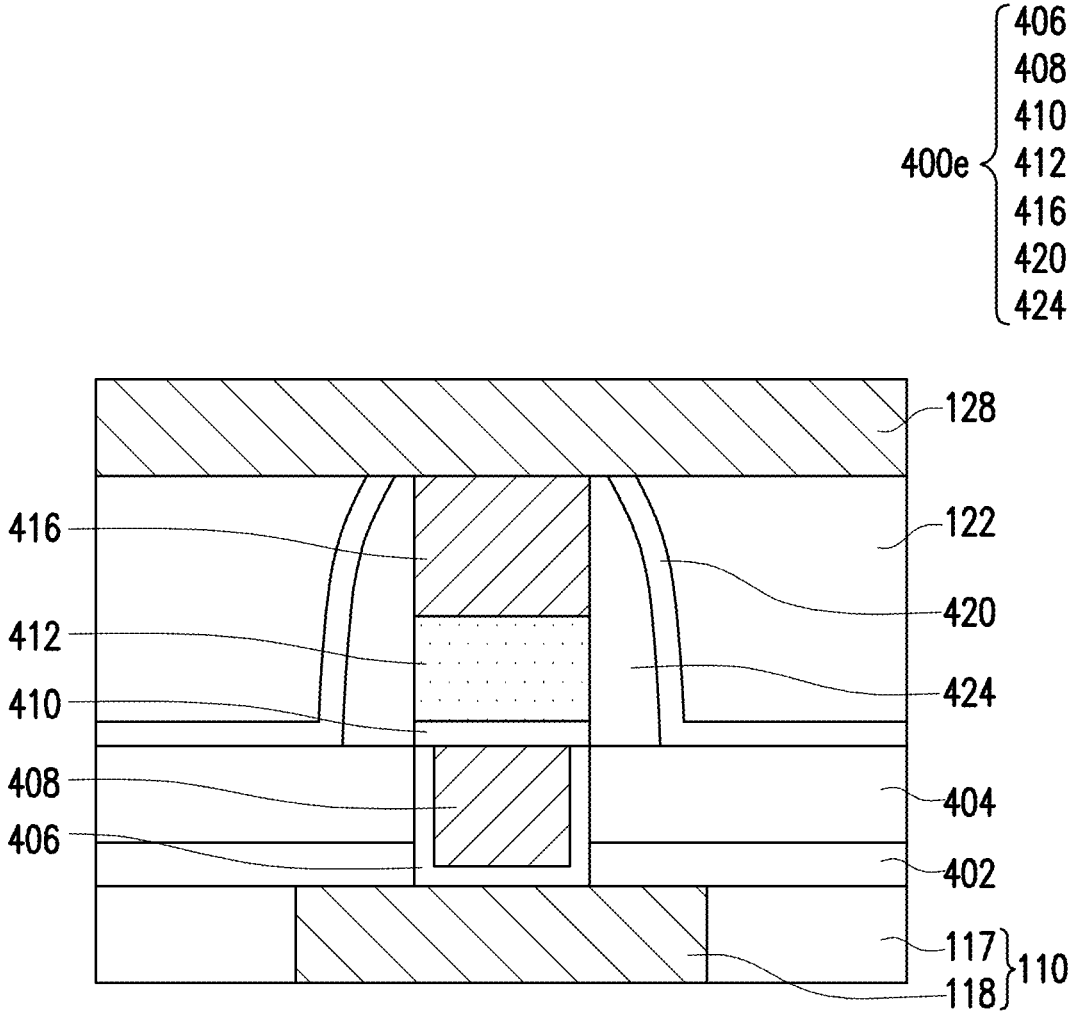

Referring to FIG. 34, in some embodiments, the memory cell 400b is similar to the memory element 400 of FIG. 32; that is, the structures, materials, and functions of the memory element 400b are similar to those of the memory element 400, and thus the details are omitted herein. The main difference between the memory element 400b and the memory element 400 lies in that the memory cell 400b further includes dielectric spacers 424 at sidewalls of the first buffer layer 410, the storage element layer 412, the second buffer layer 414, and the top electrode 416. The details (e.g., the formation, material, thickness, configuration or the like) of the dielectric spacers 424 may be similar to or substantially identical to the details (e.g., the formation, material, thickness, configuration or the like) of the dielectric spacers 224 previously described in FIG. 9, and thus are not repeated herein. Alternatively, the memory cell 400b may further adopt a selector as discussed in FIG. 8 above.

However, the disclosure is not limited thereto. The memory cell 400 may exclude the second buffer layer 414 (e.g., a memory cell 400c depicted in FIG. 35). The memory cell 400a may exclude the second buffer layer 414 (e.g., a memory cell 400d depicted in FIG. 36). The memory cell 400b may exclude the second buffer layer 414 (e.g., a memory cell 400e depicted in FIG. 37). The disclosure is not limited thereto. In one alternative embodiment, the memory cell 400e may further adopt a selector as discussed in FIG. 8 above.

Figure 38:
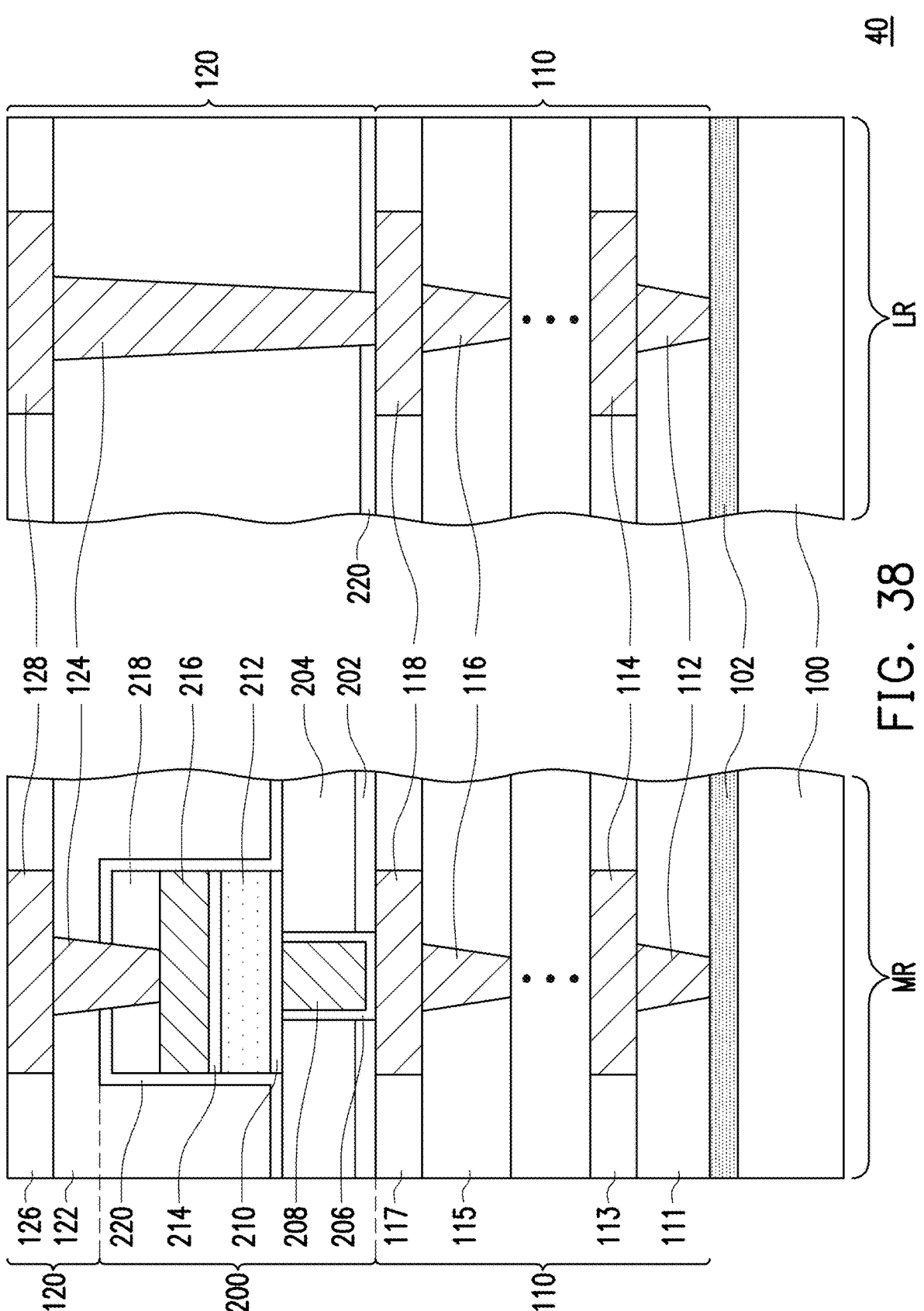
FIG. 38 is a schematic cross-sectional view of a semiconductor device in accordance with some alternative embodiments of the disclosure.

FIG. 38 is a schematic cross-sectional view of a semiconductor device in accordance with some alternative embodiments of the disclosure. The memory cell 200 illustrated in the following embodiments is applied to a PCM cell. The structures, materials, and processes may be similar to what are shown in, and discussed referring to, FIG. 1 through FIG. 7. The details are thus no repeated herein. It is noted that other memory cells 200a-200m, 300, 300a-300c, 400, 400a-400c may individually substitute the memory cell 200 to form the semiconductor device of the example.

Referring to FIG. 38, a semiconductor device 40 may include memory region MR and a logic region LR. In some embodiments, the memory region MR includes a substrate 100, a device region 102, a first interconnect structure 110, the memory cell 200, and a second interconnect structure 120. In certain embodiments, the logic region LR includes the substrate 100, the device region 102, the first interconnect structure 110, and the second interconnect structure 120.

In some embodiments, the substrate 100 is a semiconductor substrate, such as a bulk semiconductor, a semiconductor-on-insulator (SOI) substrate, or the like. The substrate 100 may be doped (e.g., with a p-type or an n-type dopant) or undoped. The substrate 100 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 102 is disposed on the substrate 100 in a front-end-of-line (FEOL) process. The device region 102 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 102 includes a gate structure, source and drain regions, and isolation structures such as shallow trench isolation (STI) structures (not shown). In the device region 102, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 100. The functions of the devices may include memory, processors, sensors, amplifiers, power distribution, input/output circuitry, or the like.

As illustrated in FIG. 38, the first interconnect structure 110 in the memory region MR is disposed on the device region 102, and the device region 102 is disposed between the substrate 100 and the first interconnect structure 110. In some embodiments, the first interconnect structure 110 includes a plurality of build-up layers (M1 to Mx−1, where x is a positive integer of 3 or greater; not labeled) formed with insulating layers and conductive layers. In detail, the first interconnect structure 110 at least includes insulating layers 111, 113, 115, 117, conductive vias 112, 116, and conductive layers 114, 118. The conductive via 112 is disposed on and electrically connected to the device region 102. The conductive layer 114 is disposed on and electrically connected to the conductive via 112. The insulating layers 111, 113 are collectively referred to as an IMD layer laterally wrapping the conductive via 112 and the conductive layer 114 to constitute a build-up layer M1. On the other hand, the conductive layer 118 is disposed on and electrically connected to the conductive via 116. The insulating layers 115, 117 are collectively referred to as an IMD layer laterally wrapping the conductive via 116 and the conductive layer 118 to constitute another build-up layer Mx−1. As shown in FIG. 38, the build-up layer M1 (111, 112, 113, 114) is electrically connected to the build-up layer Mx−1 (115, 116, 117, 118) through other build-up layer(s) (not shown) therebetween, for example. Alternatively, the build-up layer M1 (111, 112, 113, 114) may be electrically connected to the build-up layer Mx−1 (115, 116, 117, 118), directly.

In a similar way, the first interconnect structure 110 in the logic region LR is disposed on the device region 102, and the device region 102 is disposed between the substrate 100 and the first interconnect structure 110. In some embodiments, the first interconnect structure 110 is electrically connected to the logic devices in the device region 102. In some embodiments, the first interconnect structure 110 in the logic region LR includes a plurality of build-up layers (M1' to Mn−1, where n is a positive integer of 3 or greater; not labeled) formed with insulating layers and conductive layers. In detail, the first interconnect structure 110 in the logic region LR at least includes insulating layers 111, 113, 115, 117, conductive vias 112, 116, and conductive layers 114, 118. The conductive via 112 is disposed on and electrically connected to the device region 102. The conductive layer 114 is disposed on and electrically connected to the conductive via 112. The insulating layers 111, 113 are laterally wrapping the conductive via 112 and the conductive layer 114 to constitute a build-up layer M1'. On the other hand, the conductive layer 118 is disposed on and electrically connected to the conductive via 116. The insulating layers 115, 117 are laterally wrapping the conductive via 116 and the conductive layer 118 to constitute another build-up layer Mn−1. As shown in FIG. 38, the build-up layer M1' (111, 112, 113, 114) is electrically connected to the build-up layer Mn−1 (115, 116, 117, 118) through other build-up layer(s) (not shown) therebetween, for example. Alternatively, the build-up layer M1' (111, 112, 113, 114) may be electrically connected to the build-up layer Mn−1 (115, 116, 117, 118), directly.

As further illustrated in FIG. 38, the memory cell 200 and the second interconnect structure 120 are stacked on the first interconnect structure 110 in order within the memory region MR. The memory cell 200 is electrically connected to the first interconnect structure 110 and the second interconnect structure 120. The second interconnect structure 120 in the memory region MR may include insulating layers 122, 126, a conductive via 124, and a conductive layer 128. The insulating layer 122 is disposed on the memory cell 200 to wrap the memory cell 200. The conductive via 124 is disposed in the insulating layer 122 to electrically connect to the top electrode 216. The insulating layer 126 is disposed on the insulating layer 122. The conductive layer 128 is disposed in the insulating layer 126. The conductive layer 128 is in contact with and electrically connected to the conductive via 124. In some embodiments, the insulating layers 122 and 126 are collectively referred to as an IMD layer. The conductive layer 128 is a portion of a current driving circuit (not shown) to provide current to the memory cell 200. In some embodiments, the conductive via 124 and the conductive layer 128 are formed by a dual damascene process. That is, the conductive via 124 and the conductive layer 128 may be formed simultaneously. The insulating layers 122, 126 are laterally wrapping the conductive via 124 and the conductive layer 128 to constitute a build-up layer (Mx; not labeled) or a part of a build-up layer.

Furthermore, the bottom electrode 208 of the memory cell 200 is electrically connected to the conductive layer 118 of the first interconnect structure 110, and the top electrode 216 of the memory cell 200 is electrically connected to the conductive layer 128 of the second interconnect structure 120. In some embodiments, the conductive layer 118 and the conductive layer 128 may provide the voltages to the memory cell 200 for operating the memory functions thereof. In other embodiments, one or more of the memory cells 200a-200m, 300, 300a-300c, 400, 400a-400c are used to replace the memory cell 200.

On the other hand, in some embodiments, the second interconnect structure 120 within the logic region LR is disposed on the first interconnect structure 110, and the interconnect structure 110 is disposed between the device region 102 and the second interconnect structure 120. In some embodiments, the interconnect structure 120 is electrically connected to the first interconnect structure 110. In some embodiments, the second interconnect structure 120 in the logic region LR includes the insulating layers 122, 126, the conductive via 124, and the conductive layer 128. The insulating layer 122 is disposed on the protection layer 220 extending from the memory region MR to the logic region LR. The conductive via 124 is disposed in the insulating layer 122 and the protection layer 220 to electrically connect to the conductive layer 118. The insulating layer 126 is disposed on the insulating layer 122. The conductive layer 128 is disposed in the insulating layer 126. The conductive layer 128 is in contact with and electrically connected to the conductive via 124. In some embodiments, the insulating layers 122 and 126 are collectively referred to as an IMD layer. In some embodiments, the conductive via 124 and the conductive layer 128 are formed by a dual damascene process. The insulating layers 122, 126 are laterally wrapping the conductive via 124 and the conductive layer 128 to constitute a build-up layer (Mn; not labeled) or a part of a build-up layer.

In some embodiments, the conductive layer 128 of the logic region LR is located at the same level with the conductive layer 128 of the memory region MR. In some embodiments, a height of the conductive via 124 of the logic region LR is different from a height of the conductive via 124 in the memory region MR. Alternatively, the conductive via 124 in the memory region MR may be omitted.

In some embodiments, the insulating layers 111, 113, 115, 117, 122 and 126 are independently made of a dielectric material, such as silicon oxide, silicon nitride, silicon oxynitride, a spin-on dielectric material, or a low-k dielectric material. The conductive layers 114, 118, 128 each may be a conductive trace/line/wire. The conductive layers 114, 118, 128 and the conductive vias 112, 116, 124 may independently include metals or metal alloys including one or more of Al, AlCu, Cu, Ti, TiN, W, or the like. The conductive layers 114, 118 and 128 and the conductive vias 112, 116, 124 are a portion of a current driving circuit (not shown) to provide voltages to the memory cell 200. In some embodiments, the memory cell 200 may be disposed between any two adjacent conductive layers in the back-end-of-line (BEOL) structure. In certain embodiments, the fabricating process of the memory cell 200 may be compatible with the BEOL process of the semiconductor device, thereby simplifying process steps and efficiently improving the integration density.

In accordance with some embodiments, a memory cell includes a bottom electrode, a storage element layer, a first buffer layer, and a top electrode. The storage element layer is disposed over the bottom electrode. The first buffer layer is interposed between the storage element layer and the bottom electrode, where a thermal conductivity of the first buffer layer is less than a thermal conductivity of the storage element layer. The top electrode is disposed over the storage element layer, where the storage element layer is disposed between the top electrode and the first buffer layer.

In accordance with some embodiments, a semiconductor device includes a substrate, a first interconnect structure, a memory cell, and a second interconnect structure. The first interconnect structure is disposed on the substrate. The memory cell is disposed on the first interconnect structure, where the memory cell includes a bottom electrode, a memory layer, a first thermal insulating layer, and a top electrode. The bottom electrode is electrically coupled to the first interconnect structure. The memory layer is disposed over the bottom electrode. The first thermal insulating layer is interposed between the memory layer and the bottom electrode, where a thermal conductivity of the first thermal insulating layer is less than a thermal conductivity of the memory layer. The top electrode is disposed over the memory layer, where the memory layer is disposed between the top electrode and the first thermal insulating layer. The second interconnect structure is disposed on the memory cell and electrically coupled to the top electrode.

In accordance with some embodiments, a method of manufacturing a memory cell includes the following steps: forming a bottom electrode; forming a first buffer material, a storage element material and a top electrode material over the bottom electrode; and patterning the top electrode material, the storage element material and the first buffer material to form a top electrode, a storage element layer and a first buffer layer, where the storage element layer is disposed between the bottom electrode and the top electrode, the first buffer layer is interposed between the bottom electrode and the storage element layer, and a thermal conductivity of the first buffer layer is less than a thermal conductivity of the storage element layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
a first interconnect structure;
a memory cell, disposed on the first interconnect structure, wherein the memory cell comprises:
a bottom electrode;
a storage element layer, disposed over the bottom electrode;
a first buffer layer, interposed between the storage element layer and the bottom electrode, wherein a thermal conductivity of the first buffer layer is less than a thermal conductivity of the storage element layer, wherein the first buffer layer is in contact with a first surface of the bottom electrode;
a top electrode, disposed over the storage element layer, wherein the storage element layer is disposed between the top electrode and the first buffer layer; and
a protection layer, covering the top electrode, the storage element layer, and the first buffer layer, the bottom electrode being free of the protection layer, wherein a bottommost surface of the protection layer is substantially level with or above the first surface of the bottom electrode in a stacking direction of the bottom electrode and the first buffer layer; and
a second interconnect structure, disposed on the memory cell and electrically coupled to the top electrode.

2. The semiconductor device of claim 1, where the memory cell further comprises:
a dielectric structure, laterally wrapping the bottom electrode, wherein a surface of the bottom electrode is substantially leveled with the surface of the dielectric structure, and the first buffer layer is overlaid on the surface of the bottom electrode.

3. The semiconductor device of claim 2, wherein the first buffer layer further extends over the surface of the dielectric structure.

4. The semiconductor device of claim 1, where the memory cell further comprises:
a dielectric structure, laterally wrapping the bottom electrode, wherein the surface of the bottom electrode is lower than a surface of the dielectric structure, and a bottom of a recess formed in the dielectric structure comprises the surface of the bottom electrode,
wherein the first buffer layer comprises a first portion disposed in the recess and a second portion connecting to the first portion, wherein the second portion is overlaid on the first portion and extends on the surface of the surface of the dielectric structure.

5. The semiconductor device of claim 4, wherein an angle between the bottom of the recess and a sidewall of the recess is greater than 90 degrees.

6. The semiconductor device of claim 1, wherein a sidewall of the top electrode is substantially aligned with a sidewall of the first buffer layer and a sidewall of the storage element layer.

7. The semiconductor device of claim 1, where the memory cell further comprises:

a second buffer layer, interposed between the storage element layer and the top electrode, wherein a thermal conductivity of the second buffer layer is less than the thermal conductivity of the storage element layer, and an electrical resistivity of the second buffer layer is less than an electrical resistivity of the storage element layer.

8. The semiconductor device of claim 7, wherein a sidewall of the second buffer layer is substantially aligned with a sidewall of the first buffer layer, a sidewall of the storage element layer, and a sidewall of the top electrode.

9. A semiconductor device, comprising:

a first interconnect structure;

a memory cell, disposed over the first interconnect structure, wherein the memory cell comprises:

a heater, disposed over the first interconnect structure;

a storage element layer, disposed over the heater;

a first thermal insulating layer, interposed between the storage element layer and the heater, wherein a thermal conductivity of the first thermal insulating layer is less than a thermal conductivity of the storage element layer;

a top electrode, disposed over the storage element layer; and an etching stop layer, extending along the top electrode, the first thermal insulating layer, the storage element layer and the heater; and a second interconnect structure, disposed over the memory cell, wherein in a cross-section of the semiconductor device along a stacking direction of the first interconnect structure and the second interconnect structure, the etching stop layer covers a sidewall of the heater and is between the first interconnect structure and the second interconnect structure.

10. The semiconductor device of claim 9, wherein the memory cell further comprises a second thermal insulating layer interposed between the storage element layer and the top electrode, and a sidewall of the second thermal insulating layer is substantially aligned with a sidewall of the first thermal insulating layer, a sidewall of the storage element layer, and a sidewall of the top electrode.

11. The semiconductor device of claim 9, wherein the etching stop layer physically covers a sidewall of the first thermal insulating layer, a sidewall of the storage element layer, and a sidewall of the top electrode.

12. The semiconductor device of claim 11, wherein the etching stop layer physically covers the sidewall of the heater.

13. The semiconductor device of claim 9, wherein the memory cell further comprises a hard mask layer disposed on the top electrode, and the second interconnect structure is electrically coupled to the top electrode by a conductive via penetrating through the hard mask layer, wherein a sidewall of the hard mask layer is substantially aligned with a sidewall of the first thermal insulating layer, a sidewall of the storage element layer, and a sidewall of the top electrode.

14. The semiconductor device of claim 9, wherein the memory cell further comprises a selector disposed on and electrically coupled to the top electrode, and the second interconnect structure is electrically coupled to the top electrode through the selector, wherein a sidewall of the selector is substantially aligned with a sidewall of the first thermal insulating layer, a sidewall of the storage element layer, and a sidewall of the top electrode, and wherein the top electrode is disposed between the selector and the storage element layer.

15. The semiconductor device of claim 9, wherein the memory cell further comprises dielectric spacers disposed over the first interconnect structure, wherein the dielectric spacers prop against two opposite sides of the storage element layer, and the dielectric spacers vertically extend over a sidewall of the first thermal insulating layer, a sidewall of the storage element layer, and a sidewall of the top electrode.

16. A method of manufacturing a semiconductor device, comprising:

providing a first interconnect structure;

forming a memory cell over the first interconnect structure, comprising:

forming a bottom electrode over the first interconnect structure;

forming a first buffer material, a storage element material and a top electrode material over the bottom electrode;

patterning the top electrode material, the storage element material and the first buffer material to form a top electrode, a storage element layer and a first buffer layer, wherein the storage element layer is disposed between the bottom electrode and the top electrode, the first buffer layer is interposed between the bottom electrode and the storage element layer, and a thermal conductivity of the first buffer layer is less than a thermal conductivity of the storage element layer, wherein the first buffer layer is in contact with a first surface of the bottom electrode; and disposing a protection layer covering the top electrode, the storage element layer and the first buffer layer, the bottom electrode being free of the protection layer, wherein a bottommost surface of the protection layer is substantially level with or above the first surface of the bottom electrode in a stacking direction of the bottom electrode and the first buffer layer; and forming a second interconnect structure over the memory cell.

17. The method of claim 16, wherein:

forming the first buffer material, the storage element material and the top electrode material further comprises forming a second buffer material; and patterning the top electrode material, the storage element material and the first buffer material further comprises patterning a second buffer layer, wherein the second buffer layer is interposed between the storage element layer and the top electrode, and a thermal conductivity of the second buffer layer is less than a thermal conductivity of the storage element layer.

18. The method of claim 16, wherein disposing the protection layer covering the top electrode, the storage element layer and the first buffer layer comprises conformally disposing the protection layer on the top electrode, the storage element layer, and the first buffer layer, wherein the protection layer is in physical contact with a sidewall of the top electrode, a sidewall of the storage element layer and a sidewall of the first buffer layer.

19. The method of claim 16, wherein forming the bottom electrode comprises:

providing a dielectric structure;

patterning the dielectric structure to form a through hole; and forming a conductive material into the through hole to form the bottom electrode, wherein a surface of the bottom electrode is substantially coplanar to a surface of the dielectric structure.

20. The method of claim 19, further comprising:

removing a portion of the bottom electrode by etch-back process so as to obtain a recess in the dielectric structure directly over the bottom electrode, wherein a portion of the first buffer layer and a portion of the storage element layer are extended into the recess.

* * * * *